(12) United States Patent
Sato

(10) Patent No.: US 6,528,229 B2
(45) Date of Patent: Mar. 4, 2003

(54) POSITIVE PHOTORESIST COMPOSITION

(75) Inventor: Kenichiro Sato, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 163 days.

(21) Appl. No.: 09/789,823

(22) Filed: Feb. 22, 2001

(65) Prior Publication Data

US 2001/0041303 A1 Nov. 15, 2001

(30) Foreign Application Priority Data

Feb. 23, 2000 (JP) ........................ 2000-046129

(51) Int. Cl.[7] ................. G03F 7/016; G03F 7/004; G03F 7/039
(52) U.S. Cl. ................ 430/170; 430/176; 430/270.1; 430/905; 522/31; 522/32
(58) Field of Search ................ 430/270.1, 905, 430/170, 176; 522/31, 32

(56) References Cited

U.S. PATENT DOCUMENTS

| | | | | |
|---|---|---|---|---|
| 5,258,249 A | * | 11/1993 | Kato | 430/49 |
| 6,159,655 A | * | 12/2000 | Sato | 430/270.1 |
| 6,359,078 B1 | * | 3/2002 | Boardman et al. | 430/270.1 |
| 6,416,925 B1 | * | 7/2002 | Aoai et al. | 430/270.1 |

* cited by examiner

Primary Examiner—John S. Chu

(74) Attorney, Agent, or Firm—Sughrue Mion, PLLC

(57) ABSTRACT

Provided is a positive photoresist composition which comprises (A) a resin which contains a repeating unit represented by formula (I) shown below and a repeating unit represented by formula (II) shown below and whose solubility in an alkaline developing solution increases by the action of an acid and (B) a compound which generates an acid upon irradiation with an actinic ray or radiation,

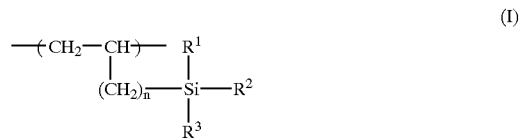

wherein $R^1$, $R^2$ and $R^3$ each independently represents an alkyl group, a haloalkyl group, a halogen atom, an alkoxy group, a trialkylsilyl group or a trialkylsilyloxy group; and n represents 0 or 1,

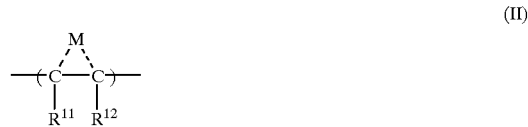

wherein M represents an atomic group necessary for forming an alicyclic structure, which may be substituted, together with the connected two carbon atoms (C—C); and $R^{11}$ and $R^{12}$ each independently represents a hydrogen atom, a cyano group, a halogen atom or an alkyl group which may be substituted.

18 Claims, No Drawings

POSITIVE PHOTORESIST COMPOSITION

FIELD OF THE INVENTION

The present invention relates to a positive photoresist composition used for the production of semiconductor integrated circuit elements, masks for producing integrated circuits, printed wiring boards and liquid crystal panels.

BACKGROUND OF THE INVENTION

In order to form a pattern for the production of electronic parts such as semiconductor devices, magnetic bubble memories and integrated circuits, a method utilizing a photoresist which is sensitive to an ultraviolet ray or a visible ray has hitherto been practically used widely. The photoresist includes a negative type photoresist in which an area irradiated with a radiation is insolubilized in a developing solution and a positive type photoresist in which an area irradiated with a radiation is conversely solubilized in a developing solution. The negative type photoresist has high sensitivity in comparison with the positive type photoresist and is excellent in adhesion to a substrate and chemical resistance which are required for wet etching, so that the negative type photoresist had took the main current of photoresist until recent years.

However, keeping step with increased density and integration of semiconductor device, the linewidth and space have extremely decreased, and dry etching has come into use for etching of substrate. Thus, high resolution and high dry etching resistance have been desired for the photoresist. As a result, the positive type photoresist occupies the most part of the photoresist field, at present.

With recent multifunctionalization and advancement of electronic equipment, it has been strongly demand to make pattern fine for the purpose of further increasing the density and integration.

Specifically, since the longitudinal dimension of integrated circuit has not been decreased so much compared with reduction in the transverse dimension thereof, increase in a ratio of the height to the width of resist pattern cannot be helped. Therefore, with advance of making pattern fine, it has become more difficult to suppress change in the size of resist pattern on a wafer having a complicated structure of difference in level.

Also, in various kinds of exposure systems, problems occur in association with reduction in the minimum dimension. For example, in case of light-exposure, the interference action of reflected light based on the difference in level of substrate has greatly influenced on the dimensional accuracy, whereas in electron beam-exposure, the proximity effect due to back scattering of electrons have made it impossible to increase the ratio of the height to the width of resist pattern.

It has been found that these many problems can be solved by the use of a multilayer resist system. With respect to the multilayer resist system, the outline thereof is described in *Solid State Technology*, 74 (1981). In addition, many investigations on the system have been made.

In general, a multilayer resist method includes a three-layer resist method and a two-layer resist method. The three-layer resist method is a method comprising coating a planarizing organic layer on a substrate having differences in level, overlaying an intermediate inorganic layer and a resist thereon, patterning the resist, then dry etching the intermediate inorganic layer using the patterned resist as a mask, and further patterning the planarizing organic layer using the intermediate inorganic layer as a mask by $O_2$ RIE (reactive ion etching). In the method, since conventional techniques can be basically used, investigations have been early initiated. However, problems are encountered in that the process is very complicated and in that cracks and pinholes are liable to occur in the intermediate layer since three layers of the organic layer, inorganic layer and organic layer different from each other in properties are overlaid with one another.

In contrast with the three-layer resist method, the two-layer resist method uses a resist having combined properties of both the resist and the intermediate inorganic layer used in the three-layer resist method, that is to say, a resist having oxygen plasma resistance. Accordingly, the occurrence of cracks and pinholes is inhibited and the process is simplified from three layers to two layers. However, the two-layer resist method has a problem in that a resist having the oxygen plasma resistance must be newly developed, although a conventional resist can be used as the upper-layer resist in the three-layer resist method.

From these circumstances, it has been desired to develop a positive type photoresist which is excellent in the oxygen plasma resistance capable of using as the upper-layer resist in the two-layer resist method and has high sensitivity and high resolution, particularly a resist of the alkali development system which can be used without changing the process now in use.

Further, in the production of VLSI which requires fabrication of an ultrafine pattern comprising linewidth of a half micron or less, a wavelength of light source for an exposure device used for lithography has become shorter and shorter, and the use of a KrF excimer laser beam or a ArF excimer laser beam is investigated. In such a photolithography using an exposure ray having a short wavelength, a so-called chemical amplification-type resist is ordinarily employed as a resist.

Particularly, in case of utilizing an ArF excimer laser beam, it is not preferred to introduce a phenol structure into a binder resin which is the main component of a resist from the standpoint of optical transparency of the resist film. Thus, a polymer containing structure which decomposes with an acid to generate a carboxylic acid, for example, a tertiary ester such as tert-butyl ester, 1-alkyladamantyl ester or a THP-protected carboxylic acid for the image-forming portion is ordinarily used as the binder resin.

However, as a result of the observation of a resist pattern formed by a scanning electron microscope (SEM), it is found that the linewidth thereof shrinks which causes a big problem in design for device. This problem is remarkable in case of using a resin containing an alicyclic group which is particularly employed in a resin for the ArF exposure.

SUMMARY OF THE INVENTION

Therefore, an object of the present invention is to provide a positive photoresist composition which provides a resist pattern in which variation of the linewidth is suppressed when the resist pattern formed in the production of semiconductor device is observed by a scanning electron microscope (SEM).

Other objects of the present invention will become apparent from the following description.

As a result of intensive investigations made by the inventors on positive resist compositions of the chemical-amplification type, it has been found that the objects of the present invention are accomplished by using an acid-decomposable resin containing specific repeating units as copolymer components to complete the present invention.

Specifically, the present invention includes the following positive photoresist compositions:

(1) a positive photoresist composition which comprises (A) a resin which contains a repeating unit represented by formula (I) shown below and a repeating unit represented by formula (II) shown below and whose solubility in an alkaline developing solution increases by the action of an acid and (B) a compound which generates an acid upon irradiation with an actinic ray or radiation,

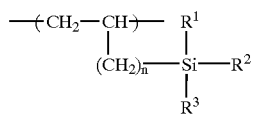
(I)

wherein $R^1$, $R^2$ and $R^3$, which may be the same or different, each independently represents an alkyl group, a haloalkyl group, a halogen atom, an alkoxy group, a trialkylsilyl group or a trialkylsilyloxy group; and n represents 0 or 1,

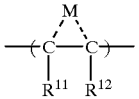
(II)

wherein M represents an atomic group necessary for forming an alicyclic structure, which may be substituted, together with the connected two carbon atoms (C—C) ; and $R^{11}$ and $R^{12}$, which may be the same or different, each independently represents a hydrogen atom, a cyano group, a halogen atom or an alkyl group which may be substituted, and (2) the positive photoresist composition as described in item (1) above, wherein the resin of (A) further contains at least one repeating unit represented by formulae (IIIa) and (IIIb) shown below:

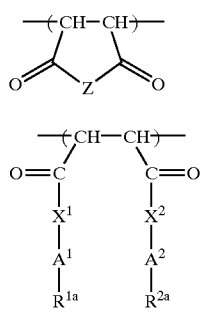
(IIIa)
(IIIb)

wherein Z represents an oxygen atom or N—$R^{3a}$; $R^{3a}$ represents a hydrogen atom, a hydroxy group, a straight-chain or branched chain alkyl group or —O—$SO_2$—$R^{4a}$; $R^{4a}$ represents an alkyl group or a trihalomethyl group; $X^1$ and $X^2$, which may be the same or different, each independently represents an oxygen atom, a sulfur atom, —NH— or —$NHSO_2$—; $A^1$ and $A^2$, which may be the same or different, each represents a single bond or a divalent linkage group; $R^{1a}$ and $R^{2a}$, which may be the same or different, each represents a hydrogen atom, a cyano group, a hydroxy group, —COOH, —$COOR^{5a}$, —CO—NH—$R^{6a}$, an alkyl group which may be substituted, an alkoxy group which may be substituted or a cyclic hydrocarbon group which may contain an ester group or a carbonyl group in the bond for forming the ring and which may be substituted; $R^{5a}$ represents an alkyl group which may be substituted or a cyclic hydrocarbon group which may contain an ester group or a carbonyl group in the bond for forming the ring and which may be substituted; and $R^{6a}$ represents an alkyl group which may be substituted.

DETAILED DESCRIPTION OF THE INVENTION

The compounds which can be used in the positive photoresist composition of the present invention will be described in greater detail below.

The resin of (A) according to the present invention is described below.

The resin of (A) is a resin containing at least one repeating unit represented by formula (I) described above and at least one repeating unit represented by formula (II) described above.

It is preferred that the resin of (A) further contains at least one repeating unit represented by formulae (IIIa) and (IIIb) describe above.

In the repeating unit represented by formula (I), $R^1$, $R^2$ and $R^3$, which may be the same or different, each independently represents a group selected from an alkyl group, a haloalkyl group, a halogen atom, an alkoxy group, a trialkylsilyl group and a trialkylsilyloxy group.

Examples of the alkyl group include preferably a straight-chain or branched alkyl group having from 1 to 10 carbon atoms, more preferably a straight-chain or branched alkyl group having form 1 to 6 carbon atoms, and still more preferably methyl, ethyl, n-propyl, isopropyl, n-butyl, isobutyl, sec-butyl and tert-butyl groups.

Examples of the haloalkyl group include chloromethyl, bromomethyl and iodomethyl groups.

Examples of the alkoxy group include preferably a straight-chain or branched alkoxy group having form 1 to 6 carbon atoms, and more preferably methoxy, ethoxy, n-propyloxy, isopropyloxy, n-butoxy, isobutoxy, sec-butoxy and tert-butoxy groups. Methoxy and ethoxy groups are particularly preferred.

Examples of an alkyl group in the trialkylsilyl group include preferably a straight-chain or branched alkyl group having form 1 to 6 carbon atoms, and more preferably methyl, ethyl, n-propyl, isopropyl, n-butyl, isobutyl, sec-butyl and tert-butyl groups. A methyl group is particularly preferred.

Examples of an alkyl group in the trialkylsilyloxy group include preferably a straight-chain or branched alkyl group having form 1 to 6 carbon atoms, and more preferably methyl, ethyl, n-propyl, isopropyl, n-butyl, isobutyl, sec-butyl and tert-butyl groups. A methyl group is particularly preferred.

Examples of the halogen atom include chlorine, bromine, fluorine and iodine atoms.

n represents 0 or 1, and preferably 1.

Specific examples of the repeating unit represented by formula (I) are set forth below, but the present invention should not be construed as being limited thereto.

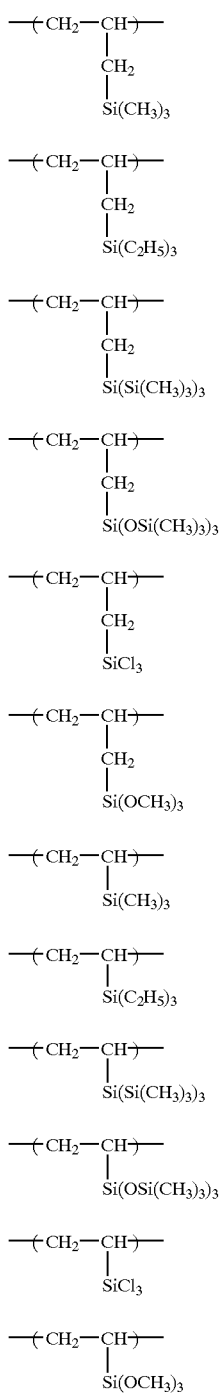

(I-1)
(I-2)
(I-3)
(I-4)
(I-5)
(I-6)
(I-7)
(I-8)
(I-9)
(I-10)
(I-11)
(I-12)

In formula (II) above, M represents an atomic group necessary for forming an alicyclic structure, which may have a substituent, together with the two connected carbon atoms (C—C).

$R^{11}$ and $R^{12}$, which may be the same or different, each represents a hydrogen atom, a cyano group, a halogen atom or an alkyl group which may be substituted.

Examples of the halogen atom for $R^{11}$ or $R^{12}$ include chlorine, bromine, fluorine and iodine atoms.

Examples of the alkyl group for $R^{11}$ or $R^{12}$ include preferably a straight-chain or branched chain alkyl group having form 1 to 10 carbon atoms, more preferably a straight-chain or branched chain alkyl group having form 1 to 6 carbon atoms, and still more preferably methyl, ethyl, n-propyl, isopropyl, n-butyl, isobutyl, sec-butyl and tert-butyl groups.

Examples of the substituent present on the alkyl group for $R^{11}$ or $R^{12}$ include a hydroxy group, a halogen atom, a carboxy group, an alkoxy group, an acyl group, a cyano group and an acyloxy group. The halogen atom as the substituent includes chlorine, bromine, fluorine and iodine atoms. The alkoxy group as the substituent includes an alkoxy group having from 1 to 4 carbon atoms such as methoxy, ethoxy, propoxy and butoxy groups. The acyl group as the substituent includes formyl and acetyl groups. The acyloxy group as the substituent includes an acetoxy group.

The atomic group necessary for forming an alicyclic structure represented by M is an atomic group necessary for forming an alicyclic hydrocarbon moiety which may be substituted. In particular, an atomic group necessary for forming a 5-membered to 8-membered monocyclic alicyclic structure or bridged alicyclic structure is preferred and an atomic group necessary for forming a bridged alicyclic structure is more preferred.

The skeleton of the bridged alicyclic hydrocarbon formed includes those described below.

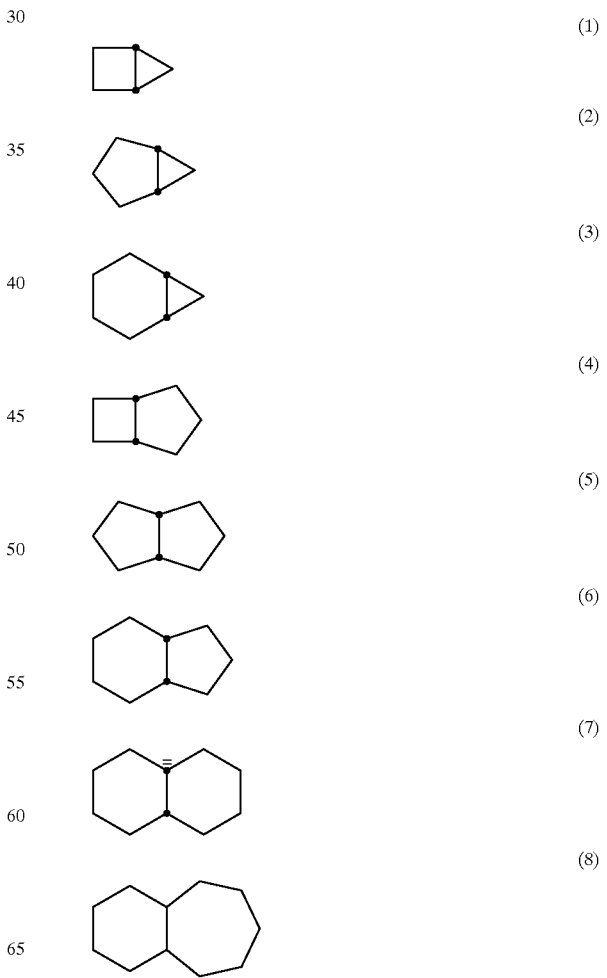

(9) 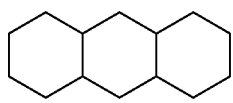
(10) 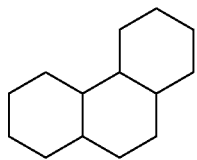
(11) 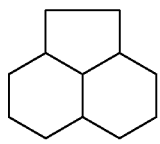
(12) 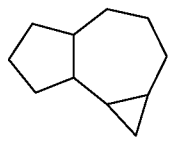
(13) 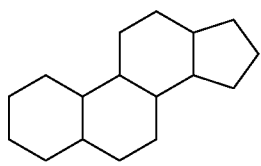
(14) 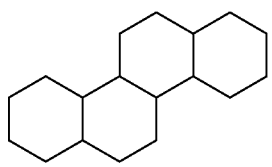
(15) 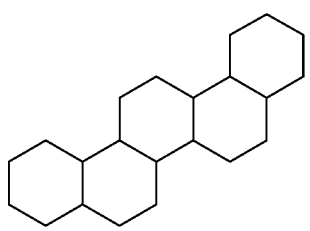
(16) 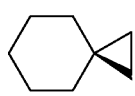
(17) 
(18) 
(19) 
(20) 
(21) 
(22) 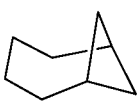
(23) 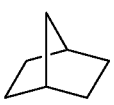
(24) 
(25) 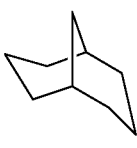
(26) 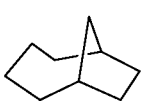
(27) 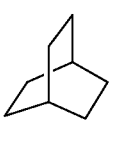
(28) 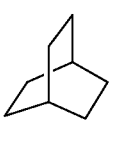
(29) 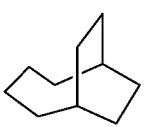

(30) 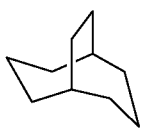

(31) 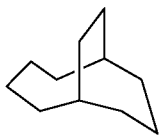

(32) 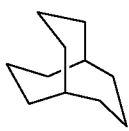

(33) 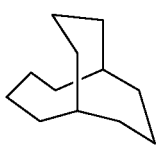

(34) 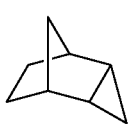

(35) 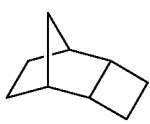

(36) 

(37) 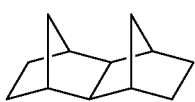

(38) 

(39) 

(40) 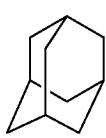

(41) 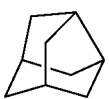

(42) 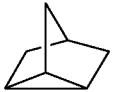

(43) 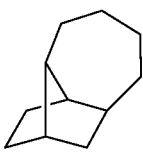

(44) 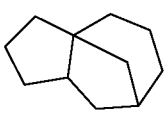

(45) 

(46) 

(47) 

The alicyclic hydrocarbon skeleton described above may have substituent(s). Examples of the substituent include a halogen atom, a cyano group, —COOH, —COOR' (wherein R' represents an alkyl group or a cyclic hydrocarbon group), an acid-decomposable group, —CO—X—A—R (wherein X, A and R each has the same meaning as defined for $X^1$, $A^1$ and $R^{1a}$ in formula (IIIb) ), an alkyl group which may be substituted and a cyclic hydrocarbon group which may be substituted.

Of the repeating units containing the bridged alicyclic hydrocarbon moiety, a repeating unit represented by formula (III-a) or (III-b) shown below is more preferred.

(III-a)

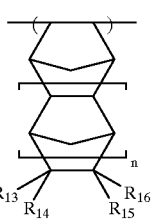

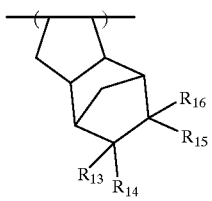

(III-b)

wherein $R^{13}$ to $R^{16}$, which may be the same or different, each independently represents a hydrogen atom, a halogen atom, a cyano group, —COOH, —COOR$^{5a}$ (wherein R$^{5a}$ has the same meaning as defined in formula (IIIb)), an acid-decomposable group, —C(=O)—X—A—R$_{17}$ or an alkyl group which may be substituted or a cyclic hydrocarbon group which may be substituted, or at least two of $R^{13}$ to $R^{16}$ may be combined with each other to form a ring; n represents 0 or 1; X represents an oxygen atom, a sulfur atom, —NH—, —NHSO$_2$— or —NHSO$_2$NH—; A represents a single bond or a divalent linkage group; R$_{17}$ represents —COOH, —COOR$^{5a}$, —CN, a hydroxy group, an alkoxy group which may be substituted, —CO—NH—R$^{6a}$, —CO—NH—SO$_2$—R$^{6a}$ (wherein R$^{5a}$ and R$^{6a}$ each has the same meaning as defined in formula (IIIb)) or a group —Y represented by the following formula:

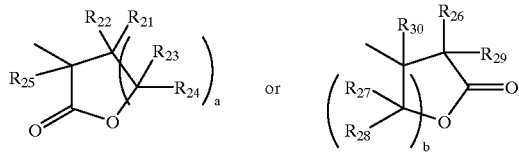

wherein R$_{21}$ to R$_{30}$, which may be the same or different, each independently represents a hydrogen atom or an alkyl group which may be substituted; and a and b each represents 1 or 2.

Examples of the halogen atom f or each Of R$_{13}$ to R$_{16}$ include chlorine, bromine, fluorine and iodine atoms.

Examples of the alkyl group for each of R$_{13}$ to R$_{16}$ include a straight-chain or branched chain alkyl group having from 1 to 10 carbon atoms, more preferably a straight-chain or branched chain alkyl group having from 1 to 6 carbon atoms, still more preferably methyl, ethyl, propyl, isopropyl, n-butyl, isobutyl, sec-butyl and tert-butyl groups.

Examples of the cyclic hydrocarbon group for each of R$_{13}$ to R$_{16}$ include a cyclic alkyl group and a bridged hydrocarbon moiety, for example, cyclopropyl, cyclopentyl, cyclohexyl, adamantyl, 2-methyl-2-adamantyl, norbornyl, bornyl, isobornyl, tricyclodecanyl, dicyclopentenyl, norbornane epoxy, menthyl, isomenthyl, neomenthyl and tetracyclododecanyl groups.

Examples of the ring formed by combining at least two of R$_{13}$ to R$_{16}$ include a ring having from 5 to 12 carbon atoms such as cyclopentene, cyclohexene, cycloheptane and cyclooctane rings.

Examples of the alkoxy group for R$_{17}$ include an alkoxy group having from 1 to 4 carbon atoms such as methoxy, ethoxy, propoxy and butoxy groups.

Examples of the substituent present on the alkyl group, cyclic hydrocarbon group or alkoxy group described above include a hydroxy group, a halogen atom, a carboxy group, an alkoxy group, an acyl group, a cyano group and an acyloxy group. The halogen atom includes chlorine, bromine, fluorine and iodine atoms. The alkoxy group includes an alkoxy group having from 1 to 4 carbon atoms such as methoxy, ethoxy, propoxy and butoxy groups. The acyl group includes such as formyl and acetyl groups. The acyloxy group includes an acetoxy group.

Examples of the divalent linkage group for A include a single bond, an alkylene group, a substituted alkylene group, an ether group, a thioether group, a carbonyl group, an ester group, an amido group, a sulfonamido group, a urethane group, a urea group and a combination of two or more of these groups.

Examples of the alkylene group or substituted alkylene group represented by A include a group having the following formula:

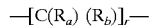

wherein R$_a$ and R$_b$, which may be the same or different, each represents a hydrogen atom, an alkyl group, a substituted alkyl group, a halogen atom, a hydroxy group or an alkoxy group; and r represents an integer of from 1 to 10.

Examples of the alkyl group for R$_a$ or R$_b$ include preferably a lower alkyl group such- as methyl, ethyl, propyl, isopropyl and butyl groups. More preferably, the alkyl group is a methyl, ethyl, propyl or isopropyl group.

Examples of the substituent present in the substituted alkyl group include a hydroxy group, a halogen atom and an alkoxy group.

Examples of the alkoxy group for R$_a$ or R$_b$ include preferably an alkoxy group having from 1 to 4 carbon atoms such as methoxy, ethoxy, propoxy and butoxy groups.

Examples of the halogen atom for R$_a$ or R$_b$ include chlorine, bromine, fluorine and iodine atoms.

In the resin of (A) according to the present invention, the acid-decomposable group may be incorporated into at least one of the repeating unit represented by formula (II), the repeating unit represented by formula (IIIb) and a repeating unit of a copolymerizable component described hereinafter.

The acid-decomposable group includes a group represented by the following formula:

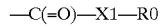

wherein R0 represents a tertiary alkyl group such as a tert-butyl or tert-amyl group, an isobornyl group, an 1-alkoxyethyl group such as an 1-ethoxyethyl, 1-butoxyethyl, 1-isobutoxyethyl or 1-cyclohexyloxyethyl group, an alkoxymethyl group such as an 1-metoxymethyl or 1-ethoxymethyl group, a tetrahydropyranyl group, a tetrahydrofuryl group, a trialkylsilyl ester group, a 3-oxocyclohexyl ester group, a 2-methyl-2-adamantyl group, a mevalonic lactone residue, a 2-(γ-butyrolactonyloxycarbonyl)-2-propyl group; and X1 represents an oxygen atom or a sulfur atom.

Specific examples of the repeating unit represented by formula (III-a) or (III-b) are set forth below as [II-1] to [II-166], but the present invention should not be construed as being limited thereto.

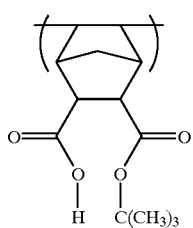 [II-1]
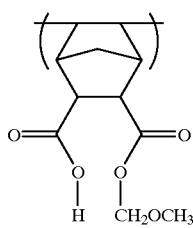 [II-2]
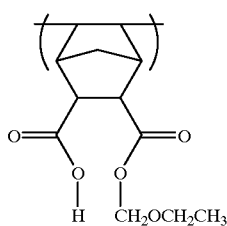 [II-3]
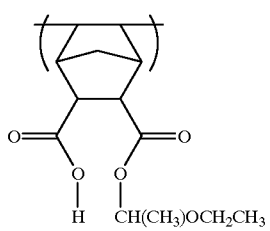 [II-4]
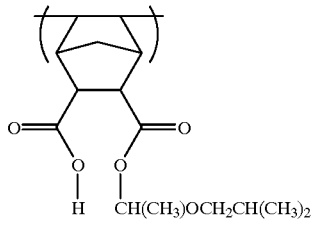 [II-5]
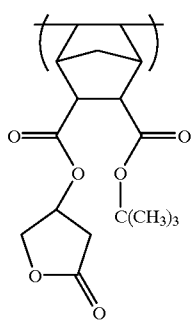 [II-6]
-continued
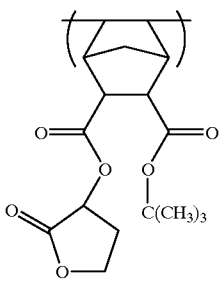 [II-7]
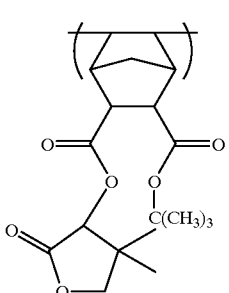 [II-8]
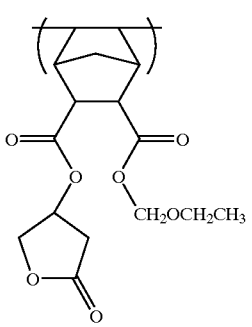 [II-9]
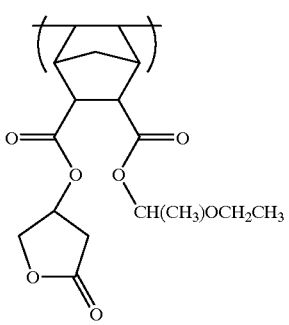 [II-10]
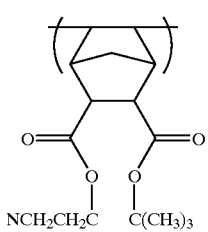 [II-11]

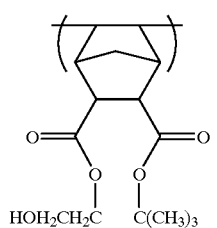
[II-12]
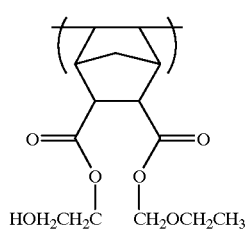
[II-13]
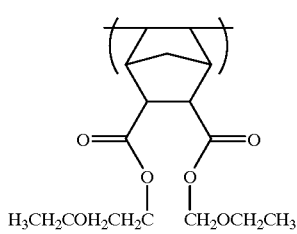
[II-14]
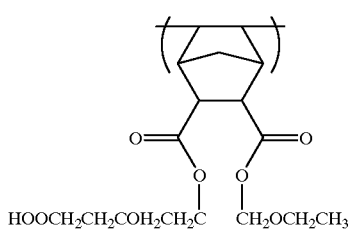
[II-15]
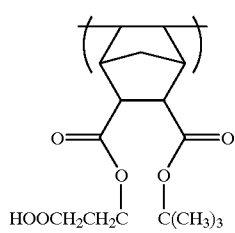
[II-16]
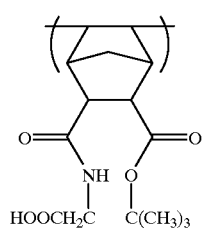
[II-17]
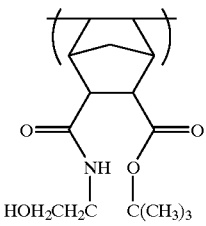
[II-18]
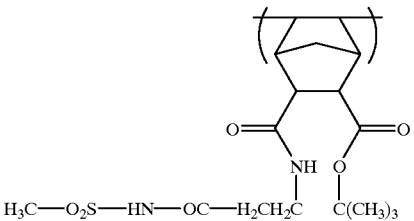
[II-19]
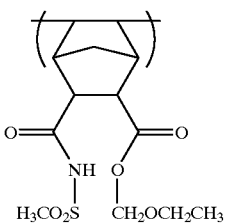
[II-20]
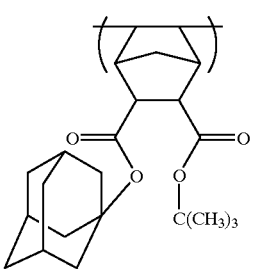
[II-21]
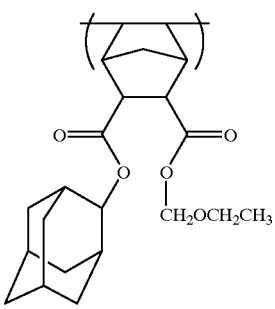
[II-22]
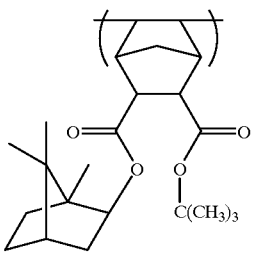
[II-23]

-continued
[II-24]
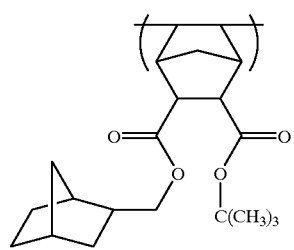
[II-25]
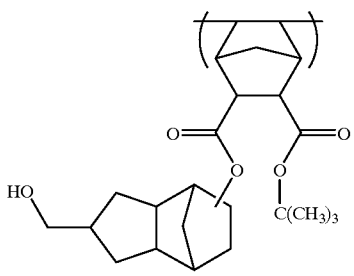
[II-26]
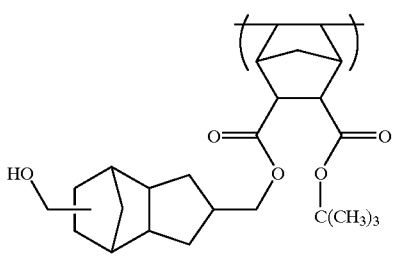
[II-27]
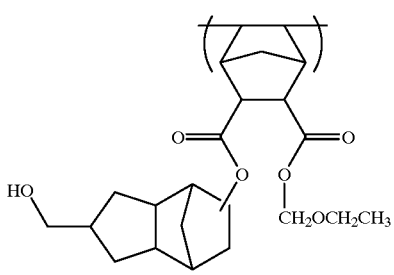
[II-28]
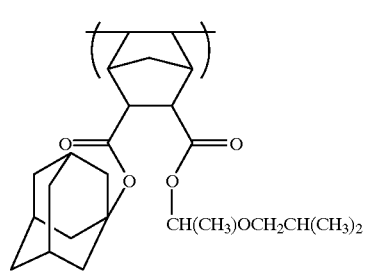
-continued
[II-29]
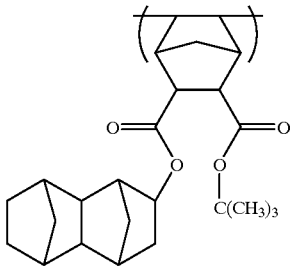
[II-30]
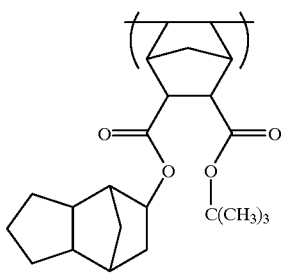
[II-31]
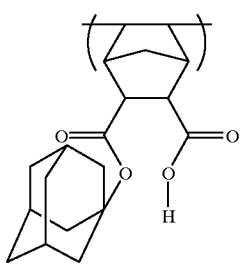
[II-32]
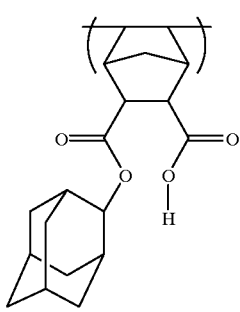
[II-33]
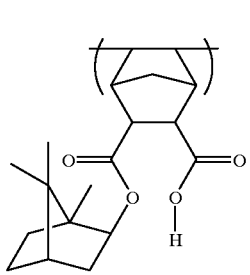

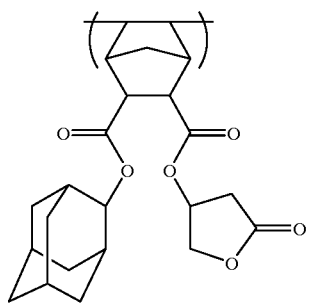 [II-34]
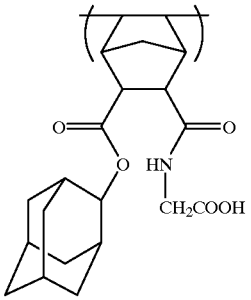 [II-39]
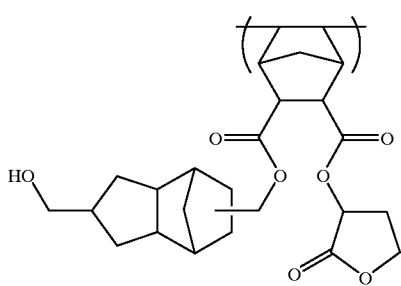 [II-35]
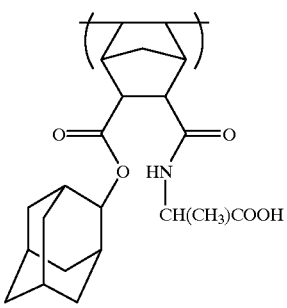 [II-40]
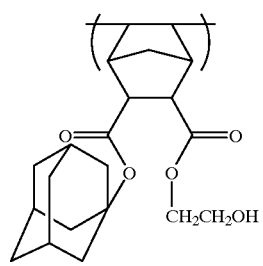 [II-36]
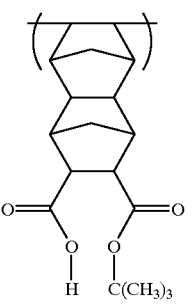 [II-41]
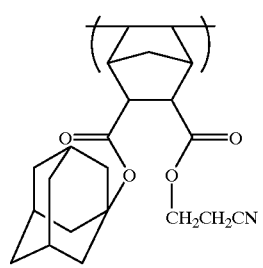 [II-37]
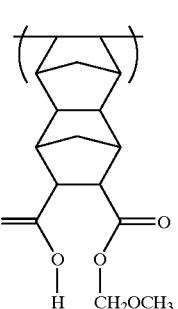 [II-42]
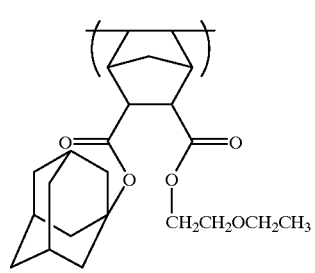 [II-38]
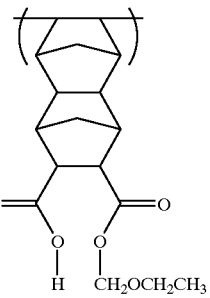 [II-43]

[II-44] 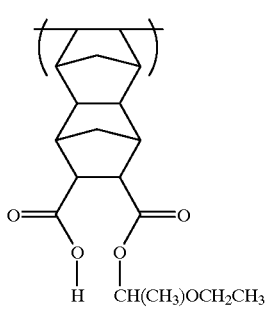
[II-45] 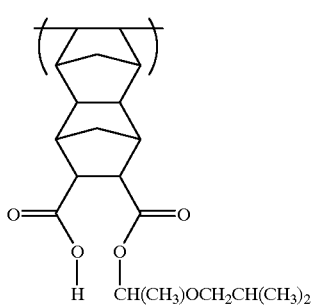
[II-46] 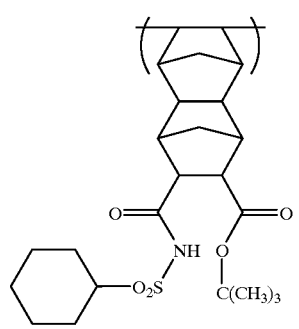
[II-47] 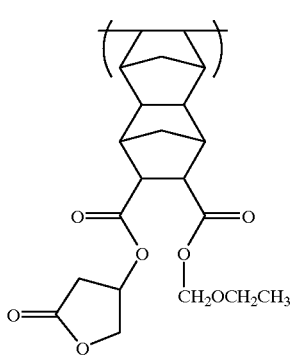
[II-48] 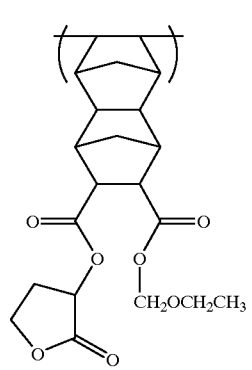
[II-49] 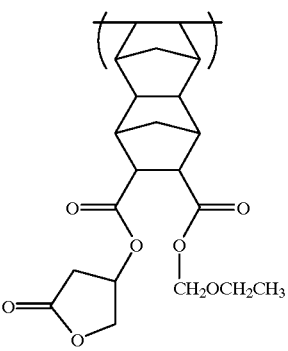
[II-50] 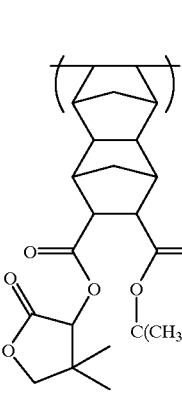
[II-51] 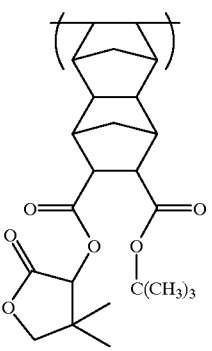
[II-52] 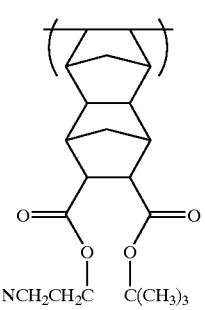
[II-53] 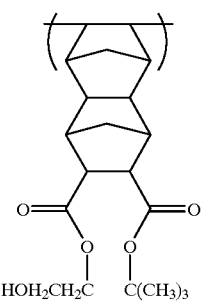
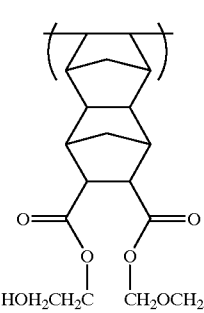

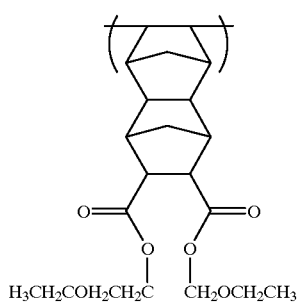
[II-54]
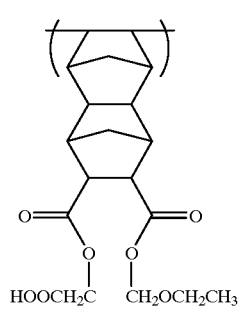
[II-55]
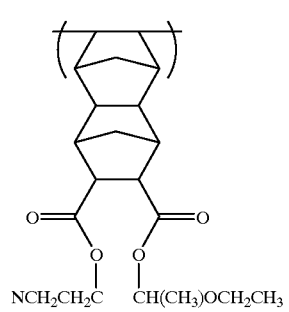
[II-56]
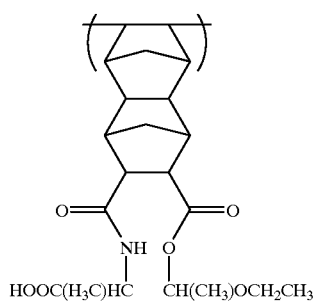
[II-57]
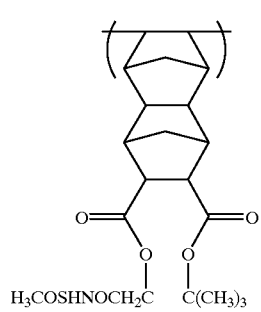
[II-58]
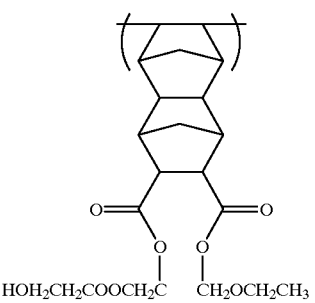
[II-59]
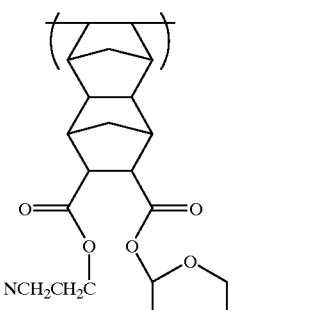
[II-60]
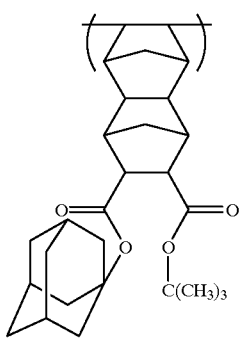
[II-61]
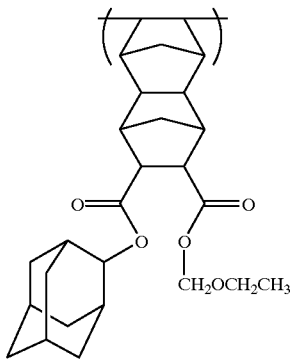
[II-62]
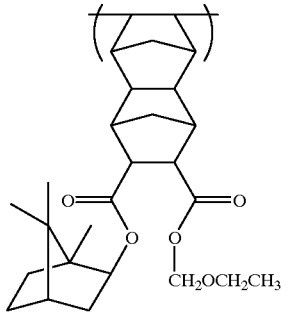
[II-63]

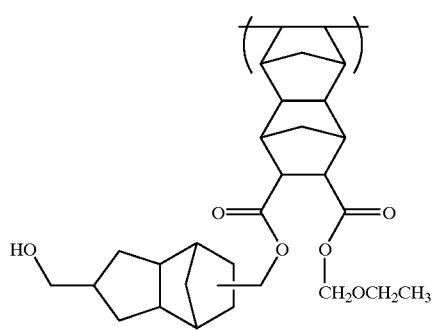
[II-64]
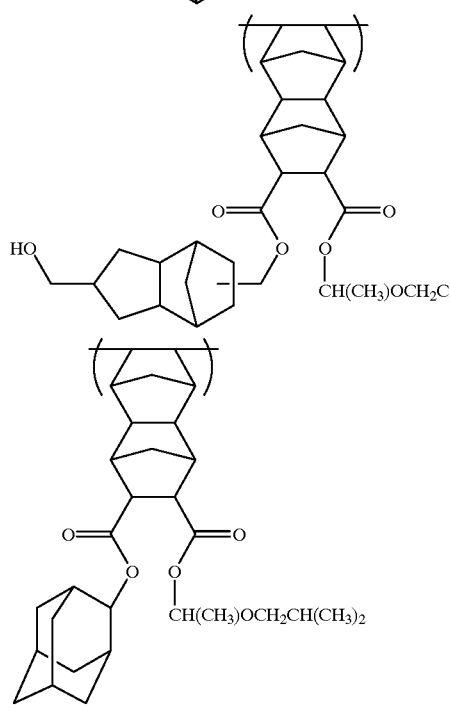
[II-65]
[II-66]
[II-67]
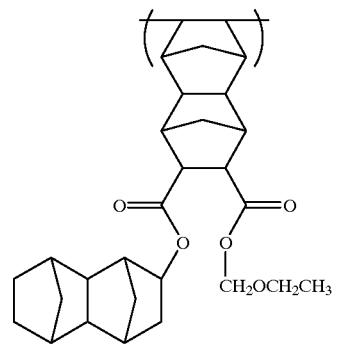
[II-67]
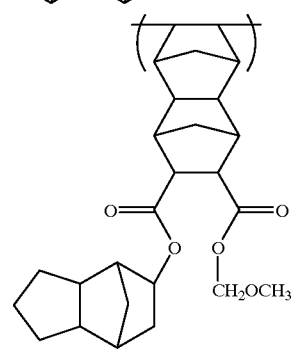
[II-68]
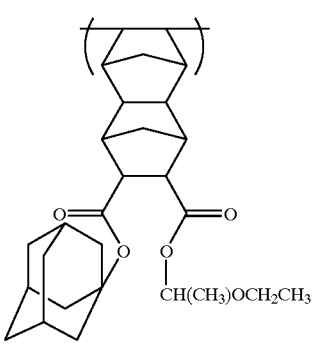
[II-69]
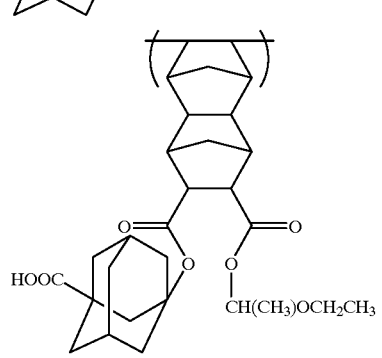
[II-70]
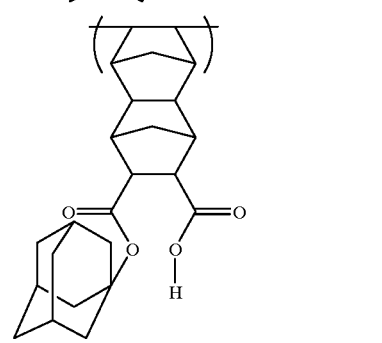
[II-71]
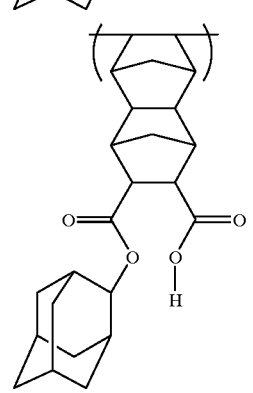
[II-72]
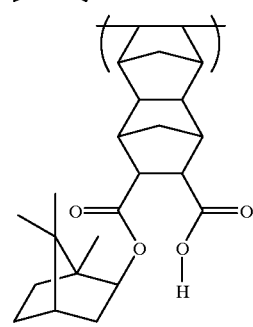
[II-73]

[II-74]
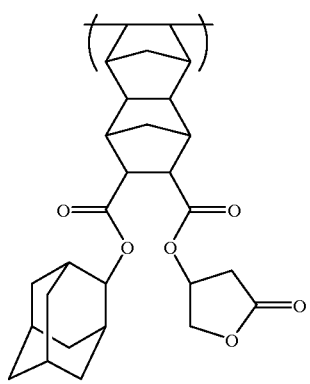
[II-75]
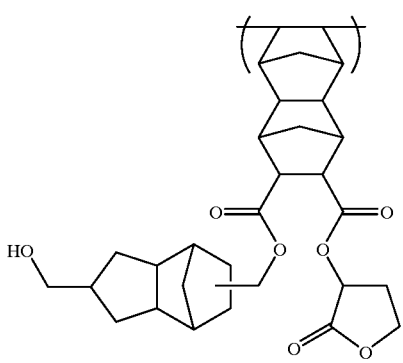
[II-76]
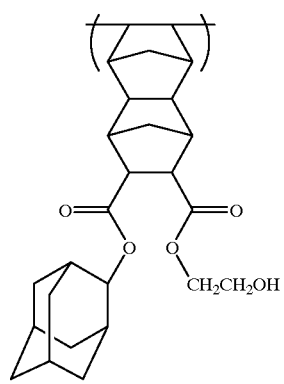
[II-77]
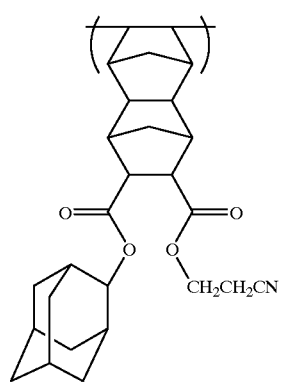
[II-78]
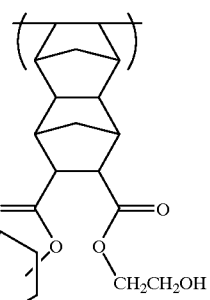
[II-79]
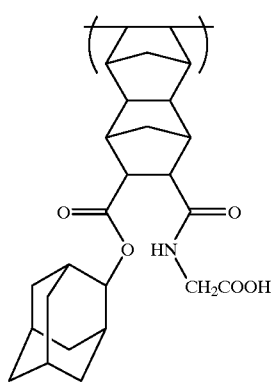
[II-80]
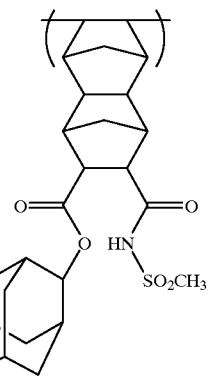
[II-81]
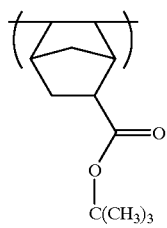
[II-82]
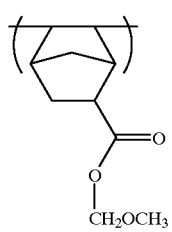

[II-83]
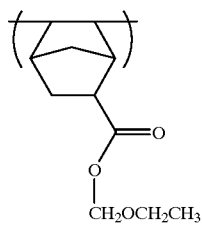
[II-84]
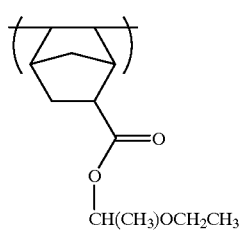
[II-85]
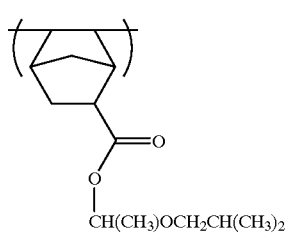
[II-86]
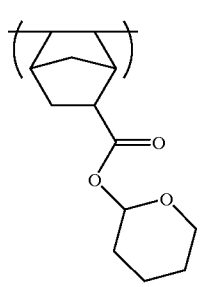
[II-87]
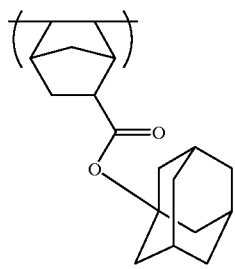
[II-88]
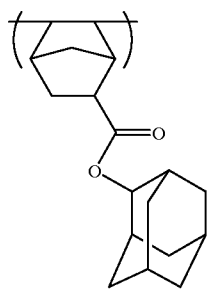
[II-89]
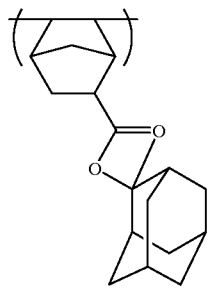
[II-90]
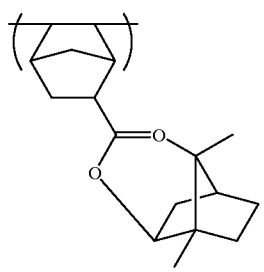
[II-91]
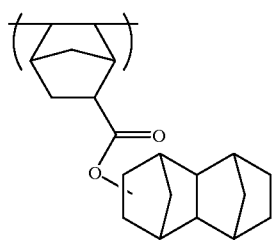
[II-92]
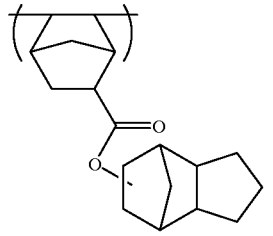
[II-93]
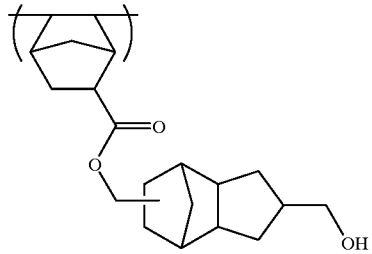
[II-94]
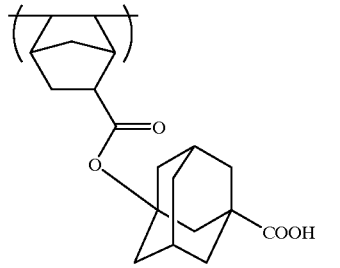

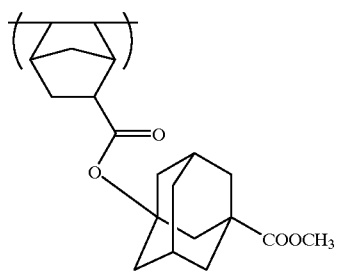
[II-95]
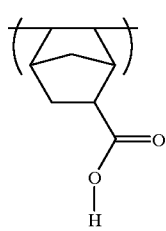
[II-96]
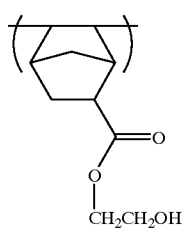
[II-97]
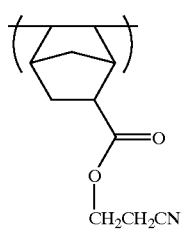
[II-98]
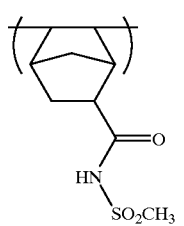
[II-99]
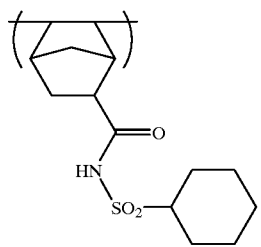
[II-100]
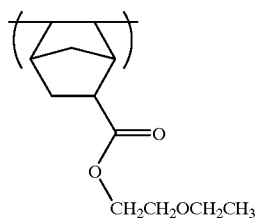
[II-101]
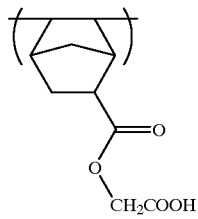
[II-102]
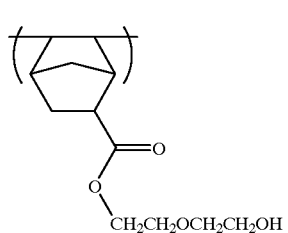
[II-103]
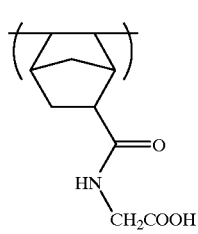
[II-104]
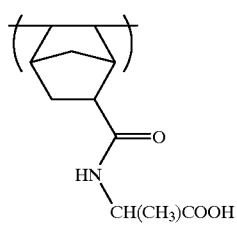
[II-105]
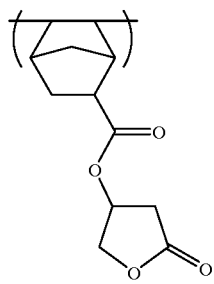
[II-106]

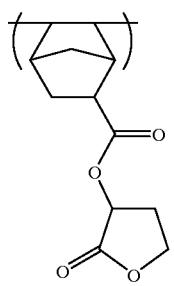
[II-107]
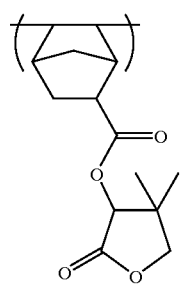
[II-108]
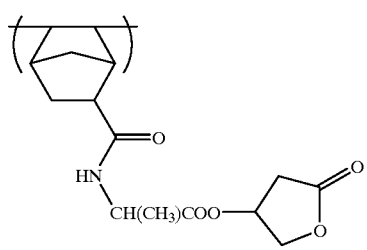
[II-109]
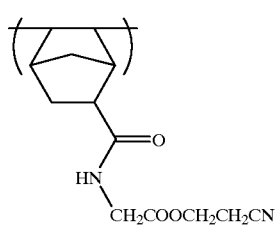
[II-110]
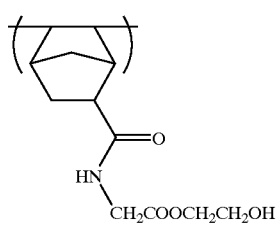
[II-111]
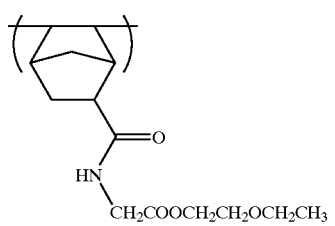
[II-112]
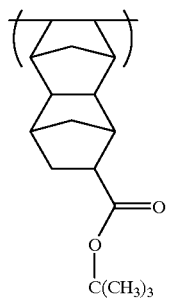
[II-113]
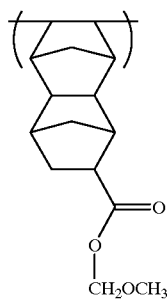
[II-114]
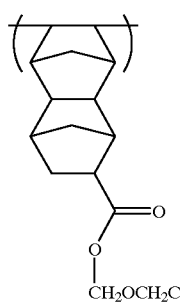
[II-115]
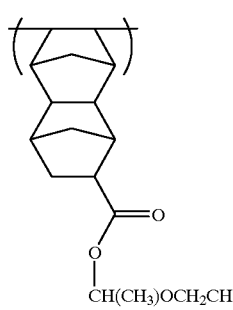
[II-116]
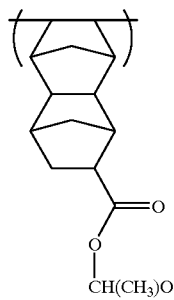
[II-117]

[II-118]

[II-119]

[II-120]

[II-121]

[II-122]

[II-123]

[II-124]

[II-125]

[II-126]

[II-127]
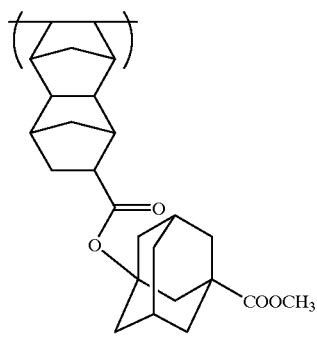
[II-128]
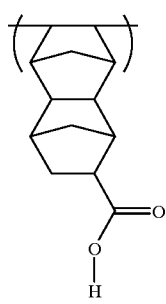
[II-129]
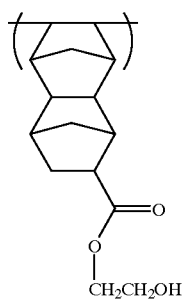
[II-130]
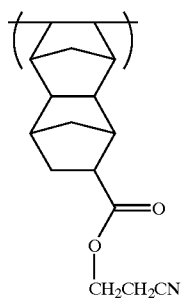
[II-131]
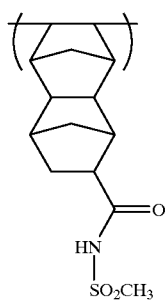
[II-132]
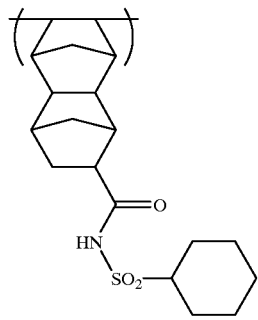
[II-133]
[II-134]
[II-135]
[II-136]
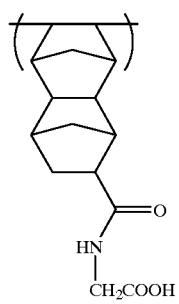

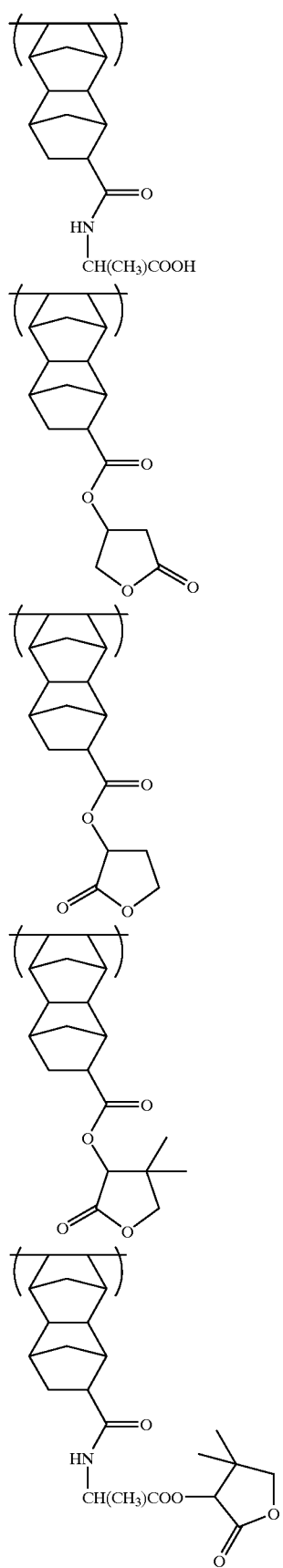
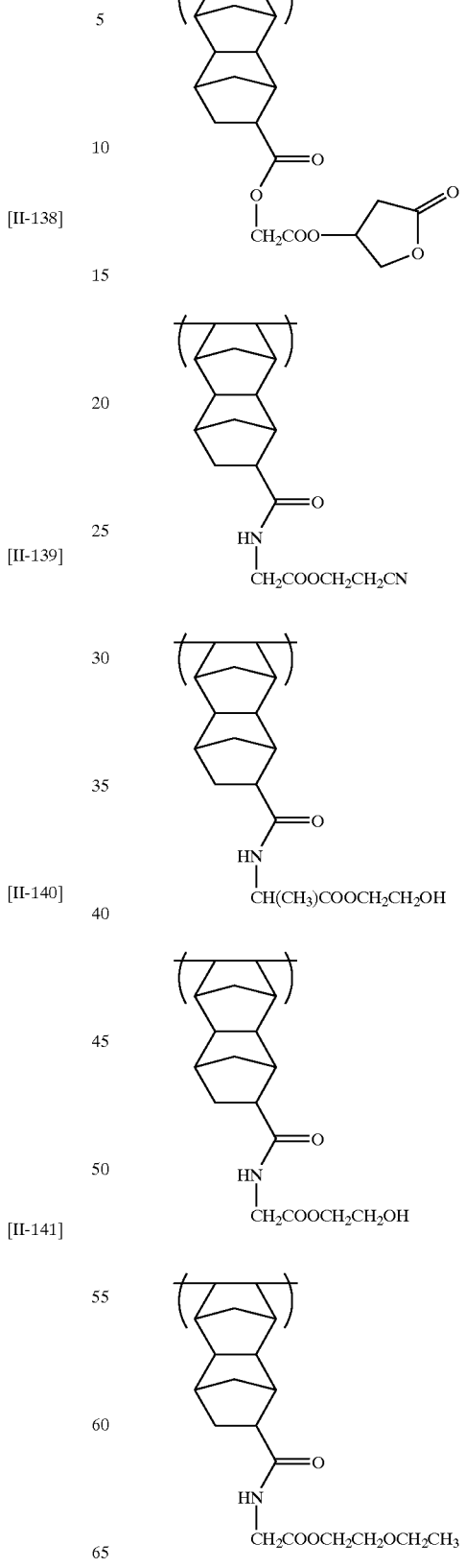

-continued
[II-147]
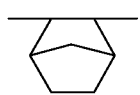
[II-148]
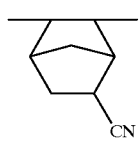
[II-149]
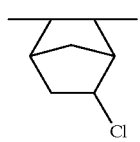
[II-149]
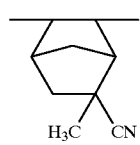
[II-150]
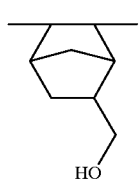
[II-151]
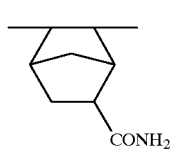
[II-152]
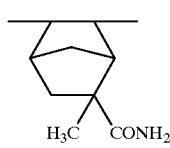
[II-153]
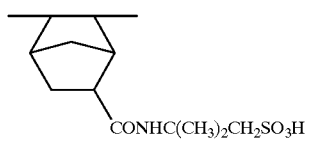
[II-154]
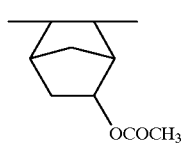
[II-155]
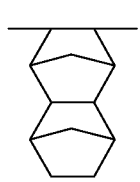
[II-156]
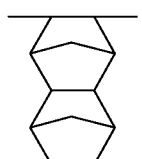
[II-157]
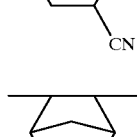
[II-158]
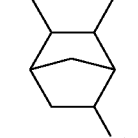
[II-159]
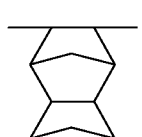
[II-160]
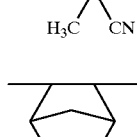
[II-161]
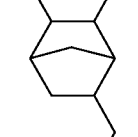
[II-162]
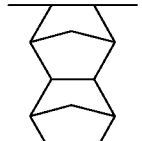
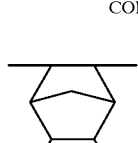
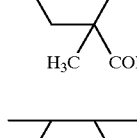
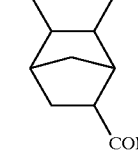

-continued

[II-163]
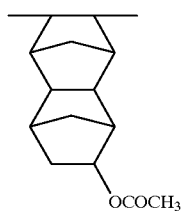

[II-164]
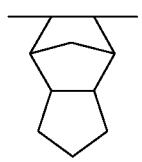

[II-165]
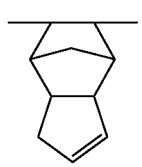

[II-166]
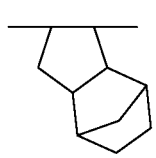

In formulae (IIIa) and (IIIb) described above, Z represents an oxygen atom or N–$R^{3a}$; $R^{3a}$ represents a hydrogen atom, a hydroxy group, a straight-chain or branched chain alkyl group or —O—$SO_2$—$R^{4a}$; and $R^{4a}$ represents an alkyl group or a trihalomethyl group.

Examples of the alkyl group for $R^{3a}$ or $R^{4a}$ include preferably a straight-chain or branched chain alkyl group having form 1 to 10 carbon atoms, more preferably a straight-chain or branched chain alkyl group having form 1 to 6 carbon atoms, and still more preferably methyl, ethyl, n-propyl, isopropyl, n-butyl, isobutyl, sec-butyl and tert-butyl groups.

$X^1$ and $X^2$, which may be the same or different, each independently represents an oxygen atom, a sulfur atom, —NH— or —$NHSO_2$—.

$A^1$ and $A^2$, which may be the same or different, each independently represents a single bond or a divalent linkage group.

$R^{1a}$ and $R^{2a}$, which may be the same or different, each independently represents a hydrogen atom, a cyano group, a hydroxy group, —COOH, —$COOR^{5a}$, —CO—NH—$R^{6a}$, an alkyl group which may be substituted, an alkoxy-group which may be substituted or a cyclic hydrocarbon group which may contain an ester group or a carbonyl group in the bond for forming the ring and which may be substituted.

$R^{5a}$ represents an alkyl group which may be substituted or a cyclic hydrocarbon group which may contain an ester group or a carbonyl group in the bond for forming the ring and which may be substituted.

$R^{6a}$ represents an alkyl group which may be substituted.

Examples of the alkyl group for $R^{1a}$, $R^{2a}$, $R^{5a}$ or $R^{6a}$ include preferably a straight-chain or branched chain alkyl group having form 1 to 10 carbon atoms, more preferably a straight-chain or branched chain alkyl group having form 1 to 6 carbon atoms, and still more preferably methyl, ethyl, n-propyl, isopropyl, n-butyl, isobutyl, sec-butyl and tert-butyl groups.

Examples of the alkoxy group for $R^{1a}$ or $R^{2a}$ include preferably a straight-chain or branched chain alkoxy group having form 1 to 6 carbon atoms, and more preferably methoxy, ethoxy, n-propyloxy, isopropyloxy, n-butoxy, isobutoxy, sec-butoxy and tert-butoxy groups.

Examples of the cyclic hydrocarbon group for $R^{1a}$, $R^{2a}$, $R^{5a}$ or $R^{6a}$ include a cyclic alkyl group and a bridged hydrocarbon moiety, for example, cyclopropyl, cyclopentyl, cyclohexyl, adamantyl, 2-methyl-2-adamantyl, norbornyl, bornyl, isobornyl, tricyclodecanyl, dicyclopentenyl, norbornane epoxy, menthyl, isomenthyl, neomenthyl and tetracyclododecanyl groups. Also, the cyclic hydrocarbon group may contain an ester group or a carbonyl group in the bond for forming the ring. Examples of such cyclic hydrocarbon group include hydroxybutyrolactone, mevalonic lactone and pantolactone residues.

Specific examples of the repeating unit represented by formula (IIIa) are set forth below, but the present invention should not be construed as being limited thereto.

[I'-1]
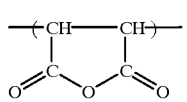

[I'-2]
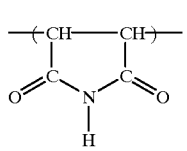

[I'-3]
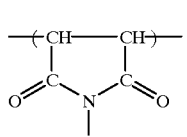

[I'-4]
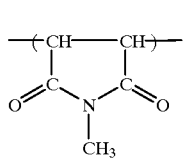

[I'-5]
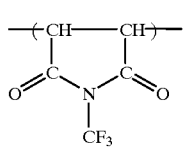

[I'-6]
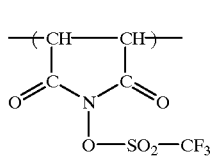

[I'-7]
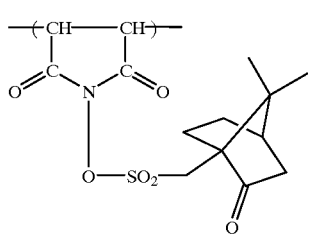

Specific examples of the repeating unit represented by formula (IIIb) are set forth below, but the present invention should not be construed as being limited thereto.

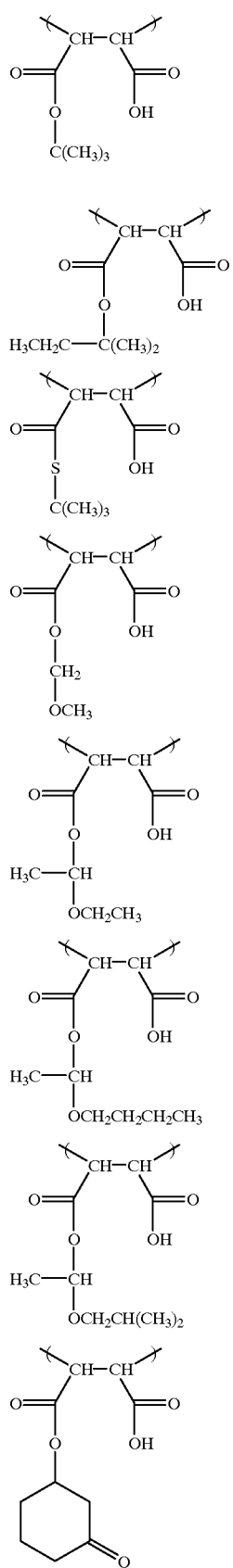
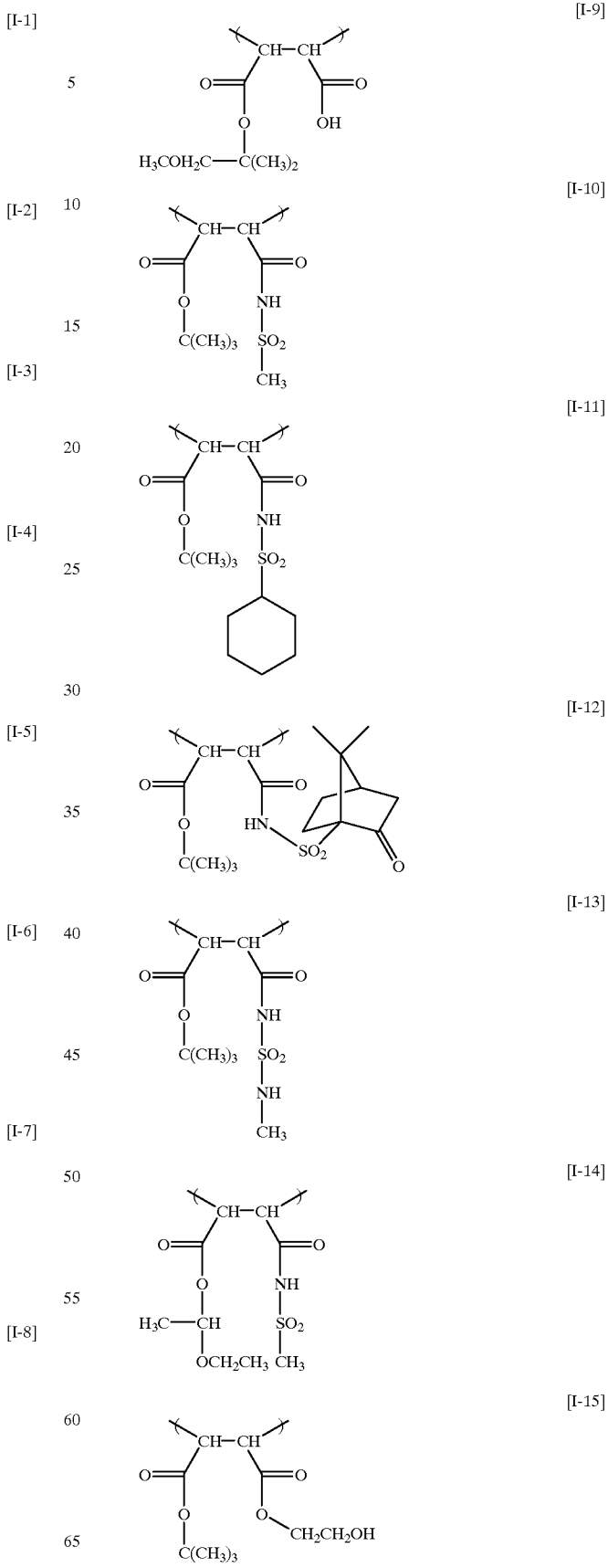

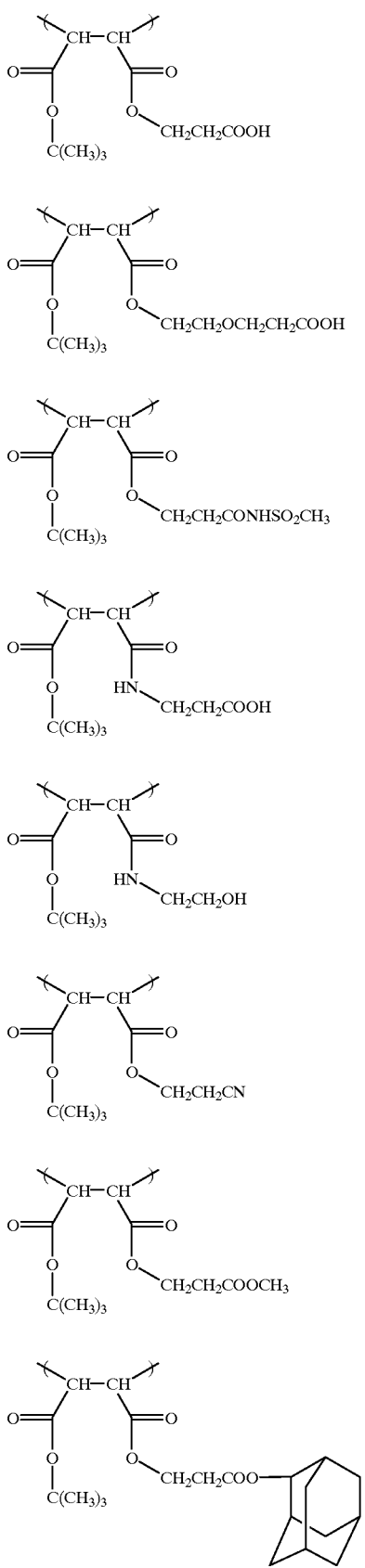
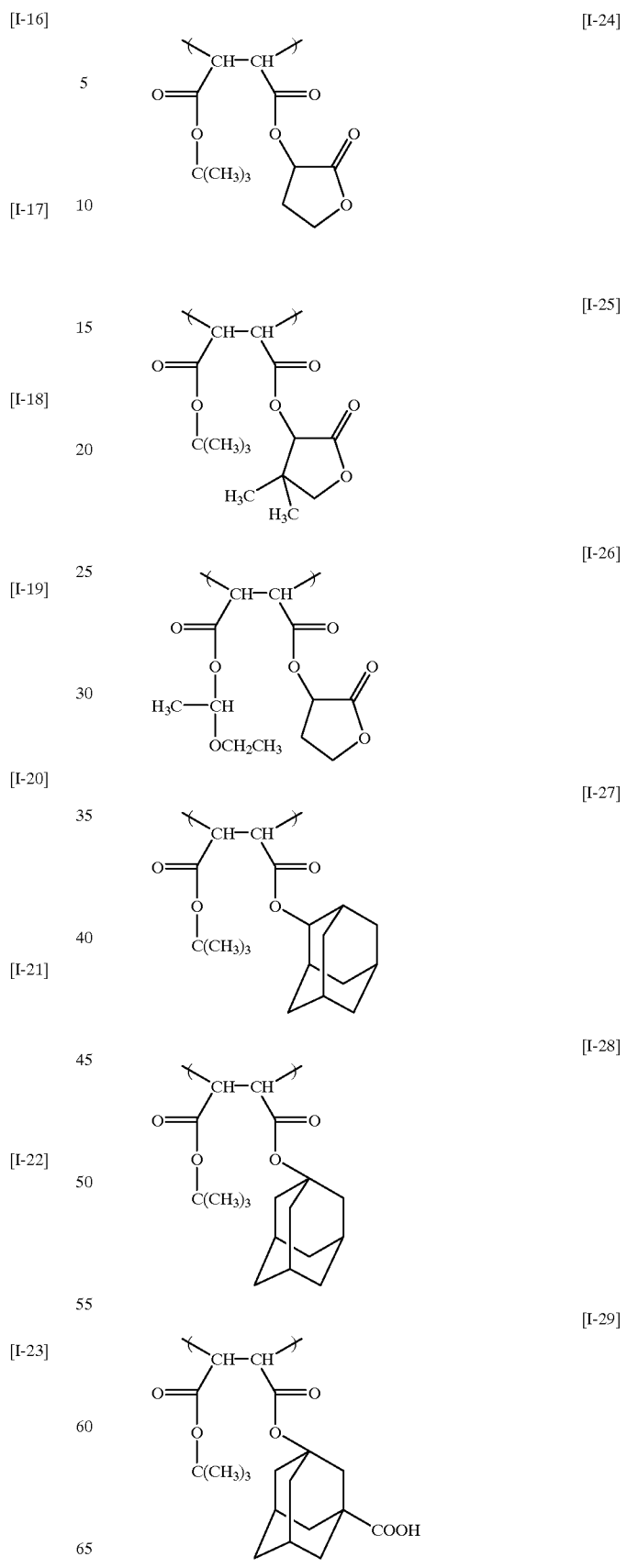

[I-30] 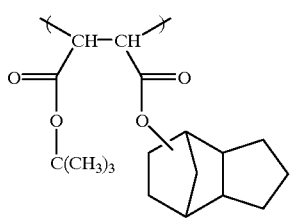
[I-31] 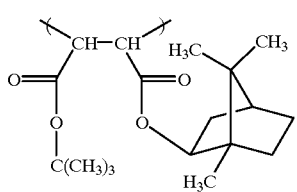
[I-32] 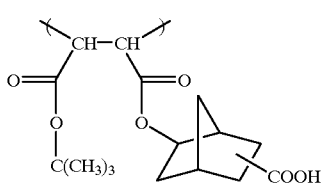
[I-33] 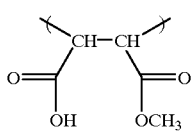
[I-34] 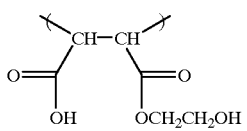
[I-35] 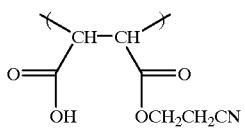
[I-36] 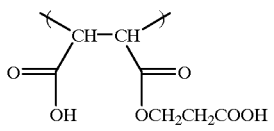
[I-37] 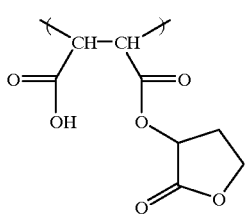
[I-38] 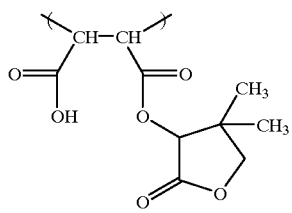
[I-39] 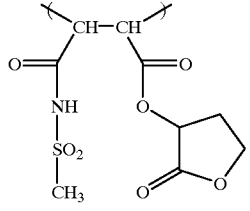
[I-40] 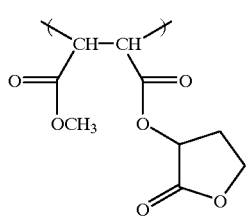
[I-41] 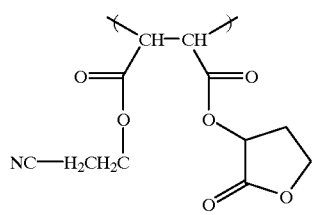
[I-42] 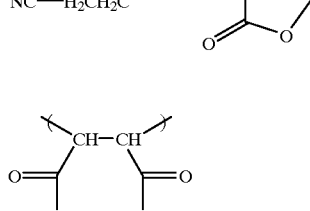
[I-43] 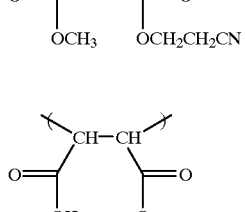
[I-44] 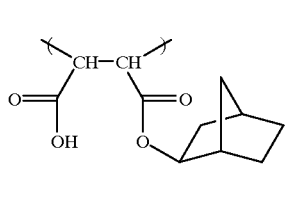

[I-45] 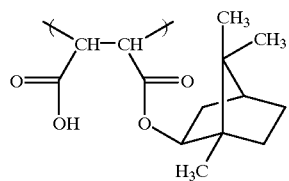
[I-46] 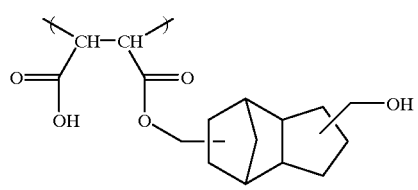
[I-47] 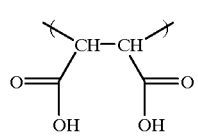
[I-48] 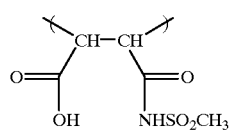
[I-49] 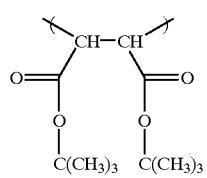
[I-50] 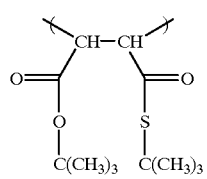
[I-51] 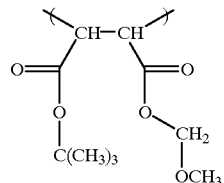
[I-52] 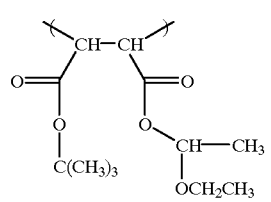
[I-53] 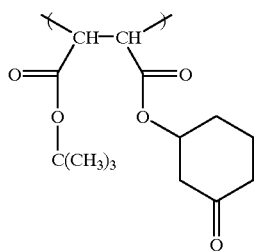
[I-54] 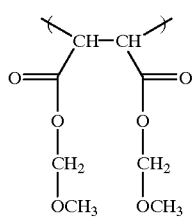
[I-55] 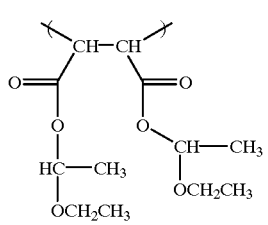
[I-56] 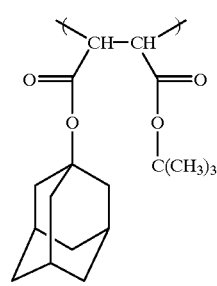
[I-57] 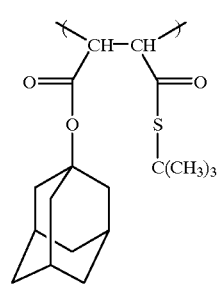
[I-58] 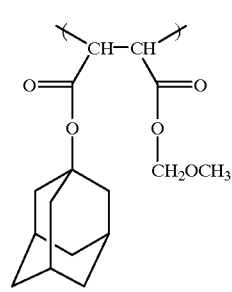

[I-59] 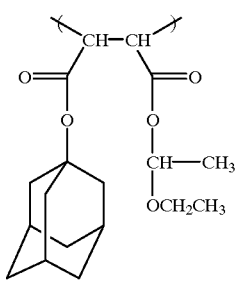

[I-60] 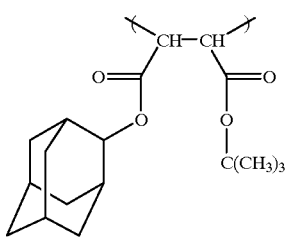

[I-61] 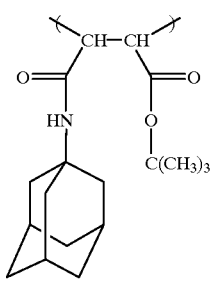

[I-62] 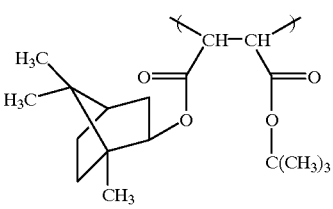

[I-63] 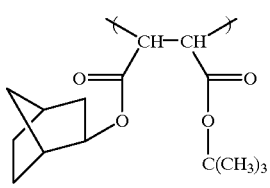

[I-64] 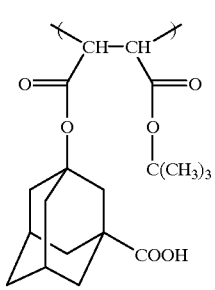

[I-65] 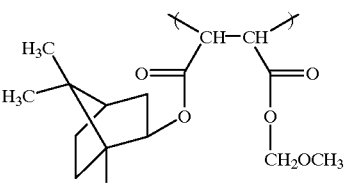

In the resin according to the present invention, monomer(s) described below may be introduced to form additional repeating unit(s) by copolymerization so long as the effects intended by the present invention can be obtained. Monomers usable for the copolymerization should not be construed as being limited to those described below.

The introduction of additional repeating units enables minute control of the characteristics required for the resin, particularly (1) solubility in a coating solvent, (2) film forming property (glass transition temperature), (3) developing property with alkali, (4) reduction in a film thickness (hydrophobicity, selection of alkali-soluble group) (5) adhesion of the unexposed area to a substrate, and (6) dry etching resistance.

Examples of such copolymerizable monomers include compounds having one addition-polymerizable unsaturated bond such as acrylates, methacrylate, acrylamides, methacrylamides, allyl compound, vinyl ethers and vinyl esters.

More specifically, the above compounds include:

acrylates such as alkyl acrylates (preferably those containing an alkyl group having from 1 to 10 carbon atoms), e.g., methyl acrylate, ethyl acrylate, propyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxy-benzyl acrylate, furfuryl acrylate and tetrahydrofurfuryl acrylate);

methacrylates such as alkyl methacrylates (preferably those containing an alkyl group having form 1 to 10 carbon atoms), e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate and tetrahydrofurfuryl methacrylate);

acrylamides such as acrylamide, N-alkylacrylamides (the alkyl group of which is an alkyl group having from 1 to 10 carbon atoms, e.g., methyl, ethyl, propyl, butyl, tert-butyl, hepthyl, octyl, cyclohexyl and hydroxyethyl), N,N-dialkylacrylamides (the alkyl group of which is an alkyl group having form 1 to 10 carbon atoms, e.g., methyl, ethyl, butyl, isobutyl, ethylhexyl and cyclohexyl), N-hydroxyethyl-N-methylacrylamide and N-2-acetamidoethyl-N-acetylacrylamide;

methacrylamides such as methacrylamide, N-alkylmethacrylamides (the alkyl group of which is an alkyl group having from 1 to 10 carbon atoms, e.g., methyl, ethyl, tert-butyl, ethylhexyl, hydroxyethyl and cyclohexyl), N,N-dialkylmethacrylamides (the alkyl group of which includes, e.g., ethyl, propyl and butyl) and N-hydroxyethyl-N-methylmethacrylamide;

allyl compounds such as allyl esters (e.g., allyl acetate, allyl caproate, ally caprate, allyl laurate, allyl palpitate, allyl stearate, allyl benzoate, allyl acetoacetate and ally lactate) and allyl oxyethanol;

vinyl ethers such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether);

vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate and vinyl cyclohexyl-carboxylate;

dialkyl itaconates (e.g., dimethyl itaconate, diethyl itaconate and dibutyl itaconate);

acrylic acid, methacrylic acid, crotonic acid, itaconic acid, acrylonitrile and methacrylonitrile.

In the resin (A) according to the present invention, a content of the repeating unit represented by formula (I), a content of the repeating unit represented by formula (II) and a content of the repeating unit represented by formula (IIIa) or (IIIb) which is preferably used can be appropriately determined taking the desired oxygen plasma etching resistance, sensitivity, prevention of cracking in a resist pattern, adhesion to a substrate, resist profile, and further ordinary requirements for resist such as resolution and heat resistance into consideration.

In general, the content of the repeating unit represented by formula (I) in the resin (A) according to the present invention is ordinarily from 3 to 50% by mole, preferably from 5 to 40% by mole, and more preferably from 7 to 30% by mole based on the total repeating units of the resin.

The content of the repeating unit represented by formula (II) in the resin (A) according to the present invention is ordinarily from 15 to 50% by mole, preferably from 18 to 45% by mole, and more preferably from 20 to 40% by mole based on the total repeating units of the resin.

The content of the repeating unit represented by formula (IIIa) or (IIIb) in the resin (A) according to the present invention is ordinarily from 30 to 70% by mole, preferably from 35 to 65% by mole, and more preferably from 40 to 60% by mole based on the total repeating units of the resin.

The resin (A) according to the present invention can be obtained by copolymerization of a monomer corresponding to the repeating unit represented by formula (I) and a monomer corresponding to the repeating unit represented by formula (II) and if desired, a monomer (e.g., maleic anhydride) corresponding to the repeating unit represented by formula (IIIa) or a monomer corresponding to the repeating unit represented by formula (IIIb).

Alternatively, the resin (A) can be obtained by copolymerizing a monomer corresponding to the repeating unit represented by formula (I), a monomer corresponding to the repeating unit represented by formula (II) and a monomer (e.g., maleic anhydride) corresponding to the repeating unit represented by formula (IIIa) to synthesize a copolymer and subjecting the copolymer to a polymer reaction with an alcohol or an amine under an acid or alkaline condition to convert the repeating unit represented by formula (IIIa) to a repeating unit represented by formula (IIIb).

A weight average molecular weight of the resin (A) according to the present invention is preferably from 1,000 to 200,000 measured by GPC and calculated in terms of polystyrene. If the weight average molecular weight of the resin is less than 1,000, degradation of heat resistance and dry etching resistance may undesirably occur. On the other hand, if the weight average molecular weight of the resin is more than 200,000, undesirable effects such as degradation of developing property and film-forming property due to severe increase in viscosity.

A content of the resin (A) according to the present invention in the positive photoresist composition of the present invention is preferably from 40 to 99.99% by weight, more preferably from 50 to 99.97% by weight based on the total solid content.

Now, the compound of (B) which generates an acid upon irradiation with an actinic ray or radiation will be described in more detail below.

The compound which decomposes to generate an acid upon irradiation with an actinic ray or radiation for use in the present invention can be appropriately selected from photoinitiators for photo-cation polymerization, photoinitiators for photo-radical polymerization, photo-achromatizing agents for dyes, photo-discoloring agents, compounds which generate an acid by known light used in a microresist or the like (an ultraviolet ray or far ultraviolet ray of from 400 to 200 nm, particularly preferably, a g-line, h-line, i-line or KrF excimer laser beam), an ArF excimer laser beam, an electron beam, an X ray, a molecular beam or an ion beam, and a mixture of these compounds.

Other examples of the compound which generates an acid upon irradiation with an actinic ray or radiation for use in the present invention include the diazonium salts described, e.g., in S. I. Schlesinger, *Photogr. Sci. Eng.*, 18, 387 (1974) and T. S. Bal et al., *Polymer,* 21, 423 (1980); onium salts such as the ammonium salts described, e.g., in U.S. Pat. Nos. 4,069,055, 4,069,056 and Re 27,992 and JP-A-3-140140 (the term "JP-A" as used herein means an "unexamined published Japanese patent. application"), the phosphonium salts described, e.g., in D. C. Necker et al., *Macromolecules,* 17, 2468 (1984), C. S. Wen et al., *The. Proc. Conf. Rad. Curing ASIA,* p. 478, Tokyo (Oct. 1988) and U.S. Pat. Nos. 4,069,055 and 4,069,056, the iodonium salts described, e.g., in J. V. Crivello et al., *Macromolecules,* 10(6), 1307(1977), *Chem. & Eng. News,* Nov. 28, p. 31 (1988), European Patents 104,143, 339,049 and 410,201, JP-A-2-150848 and JP-A-2-296514, the sulfonium salts described, e.g., in J. V. Crivello et al., *Polymer J.,* 17, 73 (1985), J. V. Crivello et al., *J. Org. Chem.,* 43, 3055 (1978), W. R. Watt et al., *J. Polymer Sci.,* Polymer Chem. Ed., 22, 1789 (1984), J. V. Crivello et al., *Polymer Bull.,* 14, 279 (1985), J. V. Crivello et al., *Macromolecules,* 14(5), 1141 (1981), J. V. Crivello et al., *J. Polymer Sci.,* Polymer Chem. Ed., 17, 2877 (1979), European Patents 370,693, 161,811, 410,201, 339,049, 233,567, 297,443 and 297,442, U.S. Pat. Nos. 3,902,114, 4,933,377, 4,760,013, 4,734,444 and 2,883,827, German Patents 2,904, 626, 3,604,580 and 3,604,581, JP-A-7-28237 and JP-A-8-27102, the selenonium salts described, e.g., in J. V. Crivello et al., *Macromolecules,* 10(6), 1307 (1977) and J. V. Crivello et al., *J. Polymer Sci.,* Polymer Chem. Ed., 17, 1047 (1979), and the arsonium salts described, e.g., in C. S. Wen et al., *The. Proc. Conf. Rad. Curing ASIA,* p. 478, Tokyo (Oct., 1988); the organic halogeno-compounds described, e.g., in U.S. Pat. No. 3,905,815, JP-B-46-4605 (the term "JP-B" as used herein means "examined Japanese patent publication"), JP-A-48-36281, JP-A-5-32070, JP-A-60-239736, JP-A-61-169835, JP-A-61-169837,JP-A-62-58241, JP-A-62-212401, JP-A-63-70243 and JP-A-63-298339; the organometallic compounds/organic halogeno compounds described, e.g., in K. Meier et al., *J. Rad. Curing*, 13(4), 26(1986), T. P. Gill et al., *Inorg. Chem.*, 19, 3007 (1980), D. Astruc, *Acc. Chem. Res.*, 19(12), 377 (1896) and JP-A-2-161445; the photo-acid generators having o-nitrobenzyl type protective groups described, e.g., in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11(4), 191 (1985), F. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130(6), F. M. Houlihan et al., *Macromolecules*, 21, 2001 (1988), European Patents 290, 750, 046,083, 156,535, 271,851 and 388,343, U.S. Pat. Nos. 3,901,710 and 4,181,531, JP-A-60-198538 and JP-A-53-133022; the compounds generating a sulfonic acid on photolysis, which are represented by iminosulfonates, as described, e.g., in M. Tunooka et al., *Polymer Preprints Japan*, 35(8), G. Berner et al., *Rad. Curing*, 13(4), W. J. Mijs et al., *Coating Technol.*, 55(697), 45(1983), Akzo, H. Adachi et al., *Polymer Preprints Japan*, 37(3), European Patents 199,672, 084,515, 044,115, 618,564 and 101,122, U.S. Pat. No. 4,371,605 and 4,431,774, JP-A-64-18143, JP-A-2-245756 and JP-A-3-140109; the disulfone compounds described, e.g., in JP-A-61-166544 and JP-A-2-71270; and diazoketosulfone and diazodisulfone compounds described, e.g., in JP-A-3-103854, JP-A-3-103856 and JP-A-4-210960.

Further, polymers in the main or side chains of which the above-described groups or compounds that can generate acids upon exposure to light are introduced such as the polymers described, e.g., in M. E. Woodhouse et al., *J. Am. Chem. Soc.*, 104, 5586(1982), S. P. Pappas et al., *J. Imaging Sci.*, 30(5), 218(1986), S. Kondo et al., *Makromol. Chem., Rapid Commun.*, 9, 625(1988), Y. Yamada et al., *Makromol. Chem.*, 152, 153, 163 (1972), J. V. Crivello et al., *J. Polymer Sci.*, Polymer Chem. Ed., 17, 3845(1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 can be used.

In addition, the compounds capable of generating acids upon exposure to light as described, e.g., in V. N. R. Pillai, *Synthesis*, (1), 1(1980), A. Abad et al., *Tetrahedron Lett.*, (47) 4555(1971), D. H. R. Barton et al., *J. Chem. Soc.*, (C), 329(1970), U.S. Pat. No. 3,779,778 and European Patent 126,712 can also be used.

Of the compounds which decompose to generate an acid upon irradiation with an actinic ray or radiation described above, those which can be particularly effectively used in the positive photoresist composition of the present invention are described below.

(1) Oxazole derivative represented by formula (PAG1) shown below or s-triazine derivative represented by formula (PAG2) shown below, substituted with a trihalomethyl group:

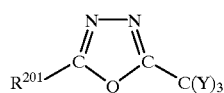

(PAG1)

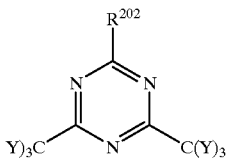

(PAG2)

wherein $R^{201}$ represents a substituted or unsubstituted aryl group or a substituted or unsubstituted alkenyl group; $R^{202}$ represents a substituted or unsubstituted aryl group, a substituted or unsubstituted alkenyl group, a substituted or unsubstituted alkyl group or —$C(Y)_3$; and Y represents a chlorine atom or a bromine atom.

Specific examples thereof include the following compounds, however, the present invention should not be construed as being limited thereto.

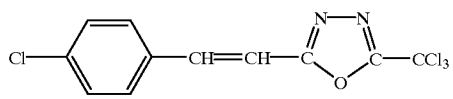

(PAG1-1)

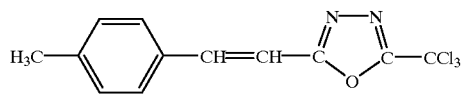

(PAG1-2)

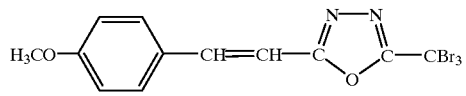

(PAG1-3)

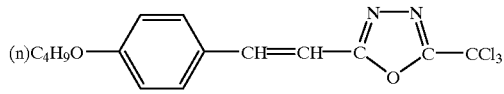

(PAG1-4)

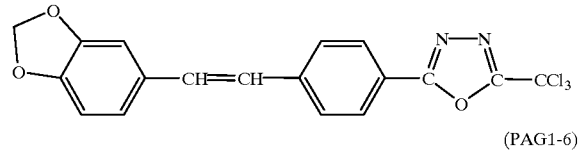

(PAG1-5)

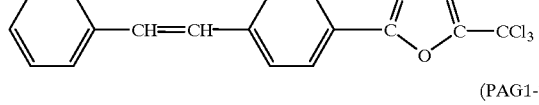

(PAG1-6)

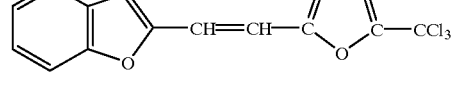

(PAG1-7)

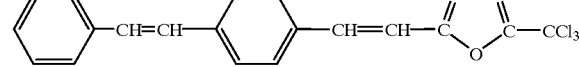

(PAG1-8)

(PAG2-1)
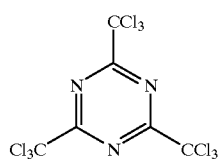
(PAG2-2)
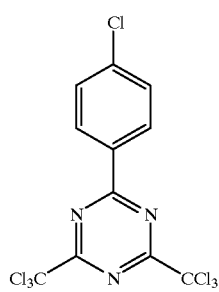
(PAG2-3)
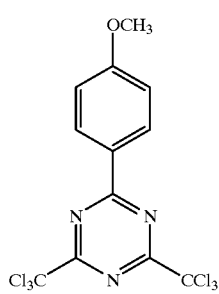
(PAG2-4)
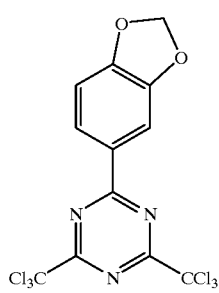
(PAG2-5)
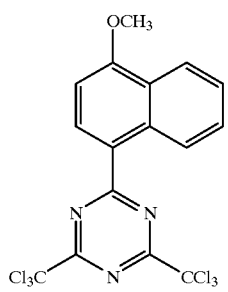
(PAG2-6)
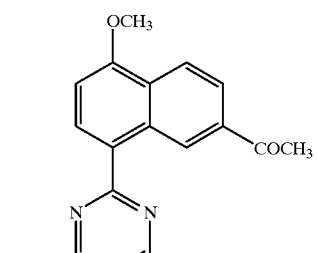
(PAG2-7)
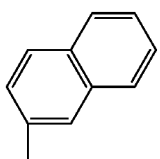
(PAG2-8)
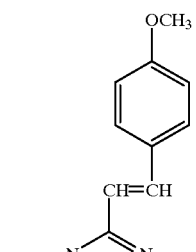
(PAG2-9)
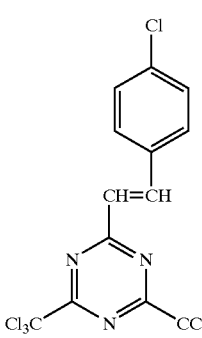
(PAG2-10)
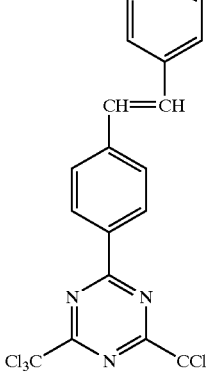
(2) Iodonium salt represented by formula (PAG3) shown below or sulfonium salt represented by formula (PAG4) shown below:
(PAG3)
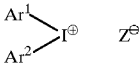
(PAG4)
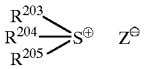

wherein $Ar^1$ and $Ar^2$, which may be the same or different, each independently represents a substituted or unsubstituted aryl group.

Preferred examples of the substituent include an alkyl group, a haloalkyl group, a cycloalkyl group, an aryl group, an alkoxy group, a nitro group, a carboxy group, an alkoxycarbonyl group, a hydroxy group, a mercapto group and a halogen atom.

$R^{203}$, $R^{204}$ and $R^{205}$, which may be the same or different, each independently represents a substituted or unsubstituted alkyl group or a substituted or unsubstituted aryl group, preferably an alkyl group having from 1 to 8 carbon atoms which may be substituted or an aryl group having from 6 to 14 carbon atoms which may be substituted. Examples of preferred substituent for the alkyl group include an alkoxy group having from 1 to 8 carbon atoms, a carboxy group and an alkoxycarbonyl group, and those for the aryl group include an alkoxy group having from 1 to 8 carbon atoms, an alkyl group having from 1 to 8 carbon atoms, a nitro group, a carboxy group, a hydroxy group and a halogen atom.

$Z^-$ represents a counter anion. Examples of the counter anion include a perfluoroalkane sulfonate anion such as $BF_4^-$, $AsF_6^-$, $PF_6^-$, $SbF_6^{2-}$, $SiF_6^{2-}$, $ClO_4^-$ and $CF_3SO_3^-$, pentafluorobenzene sulfonate anion, a condensed polynuclear aromatic sulfonate anion such as naphthalene-1-sulfonate anion, anthraquinone sulfonate anion and a sulfonic acid group-containing dye, however, the present invention should not be construed as being limited thereto.

Two of $R^{203}$, $R^{204}$ and $R^{205}$ or $Ar^1$ and $Ar^2$ may be combined through a single bond or a substituent.

Specific examples thereof include the following compounds, however, the present invention should not be construed as being limited thereto.

(PAG3-13)
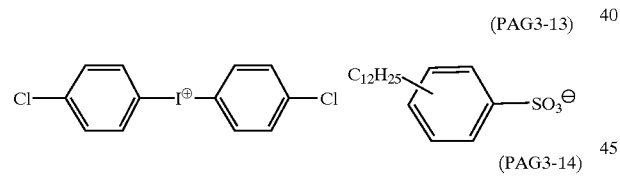

(PAG3-14)

(PAG3-15)
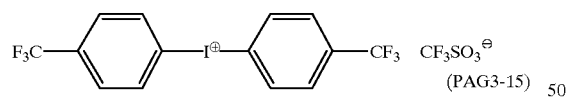

(PAG3-16)
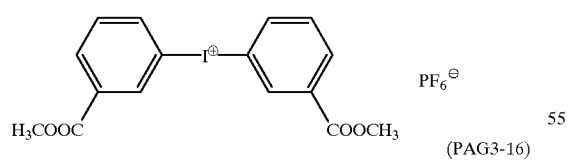

(PAG3-17)
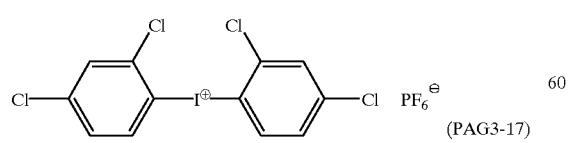

(PAG3-18)
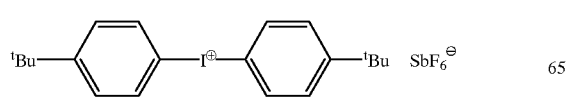

(PAG3-19)
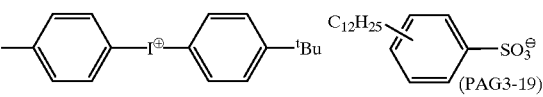

(PAG3-20)
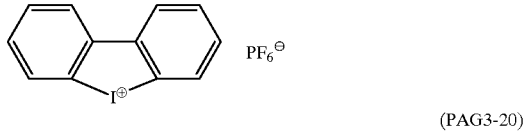

(PAG3-21)
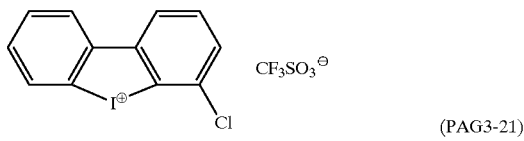

(PAG3-22)

(PAG3-23)
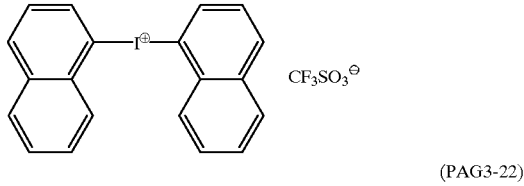

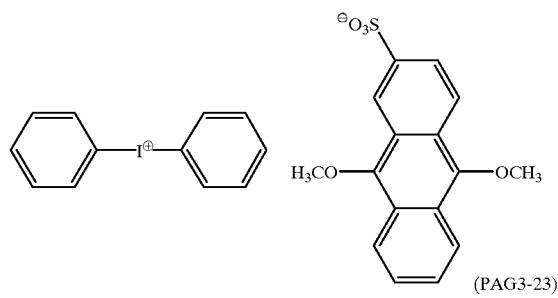

(PAG3-24)

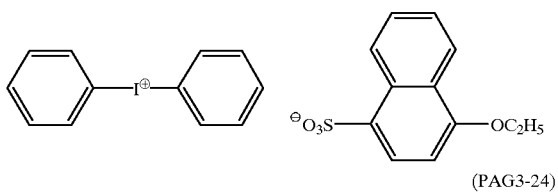

(PAG3-25)

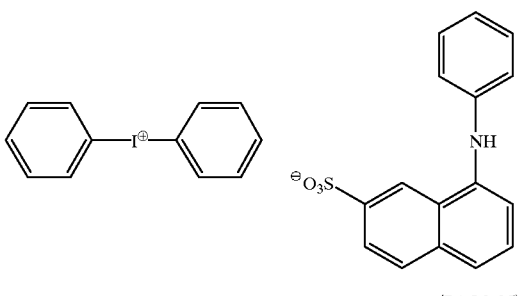

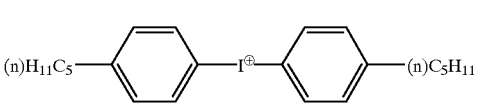

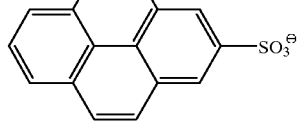

(PAG3-26)
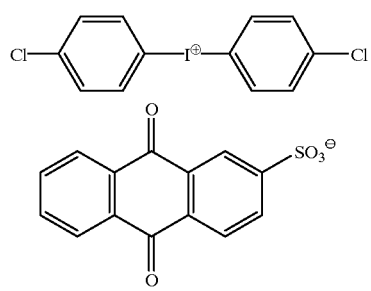
(PAG3-27)
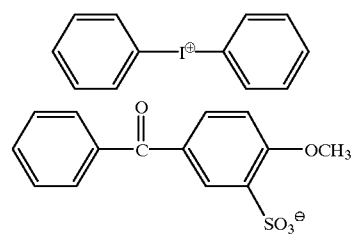
(PAG3-28)
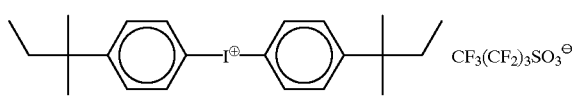 CF$_3$(CF$_2$)$_3$SO$_3^\ominus$
(PAG3-29)
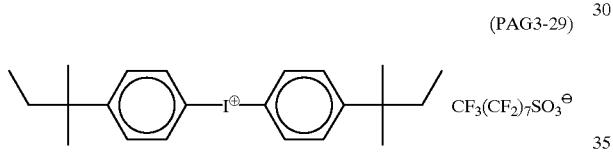 CF$_3$(CF$_2$)$_7$SO$_3^\ominus$
(PAG4-1)
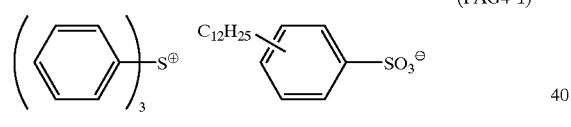
(PAG4-2)
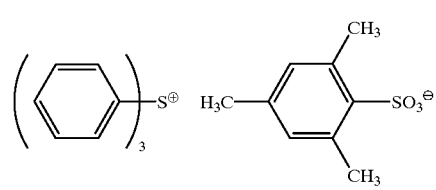
(PAG4-3)
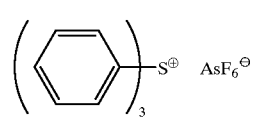
(PAG4-4)
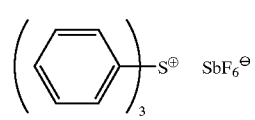
(PAG4-5)
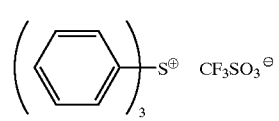
(PAG4-6)
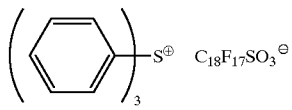
(PAG4-7)
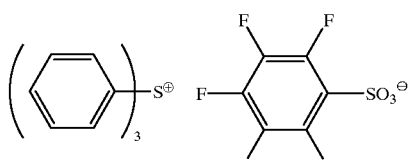
(PAG4-8)
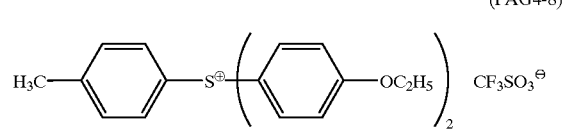
(PAG4-9)
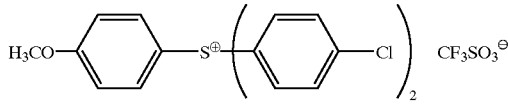
(PAG4-10)
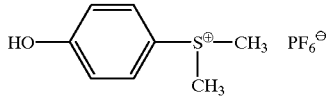
(PAG4-11)
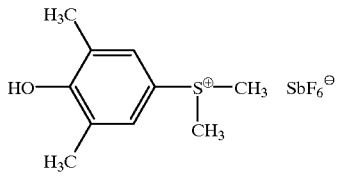
(PAG4-12)
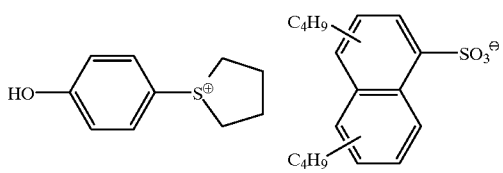
(PAG4-13)
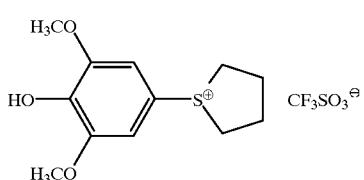
(PAG4-14)
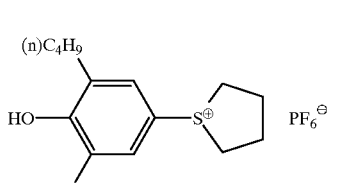

(PAG4-15)
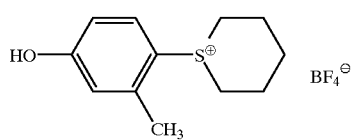
(PAG4-16)
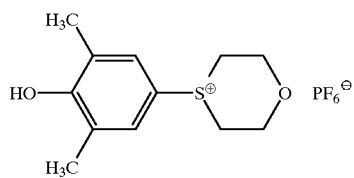
(PAG4-17)
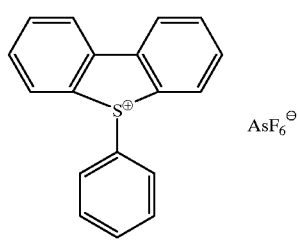
(PAG4-18)
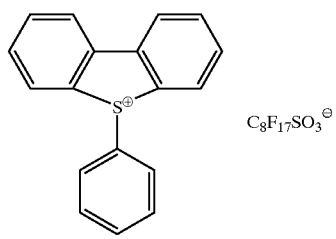
(PAG4-19)
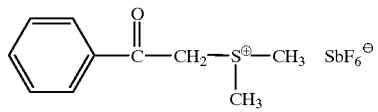
(PAG4-20)
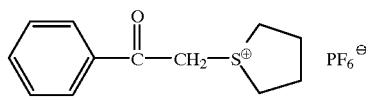
(PAG4-21)
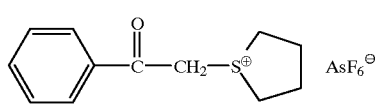
(PAG4-22)
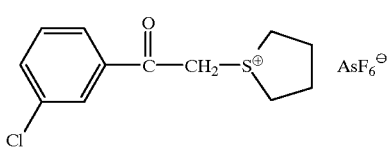
(PAG4-23)
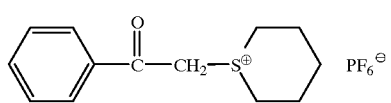
(PAG4-24)
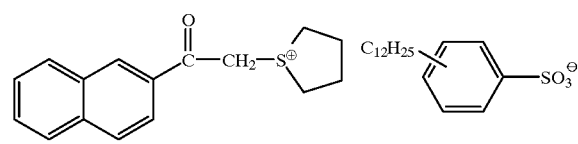
(PAG4-25)
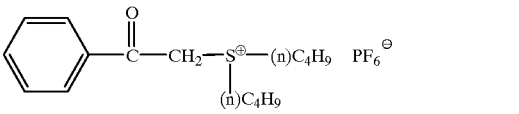
(PAG4-26)
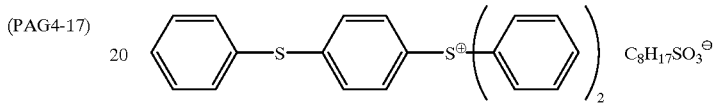
(PAG4-27)
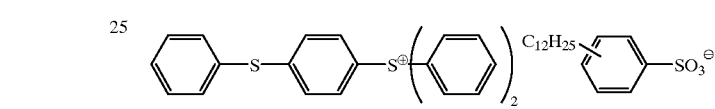
(PAG4-28)
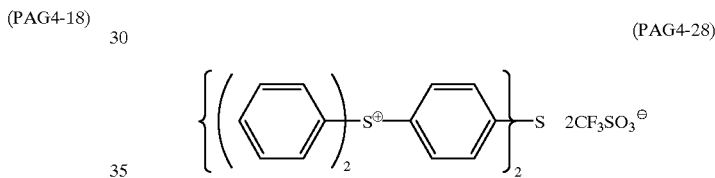
(PAG4-29)
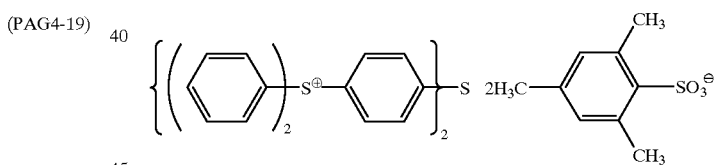
(PAG4-30)
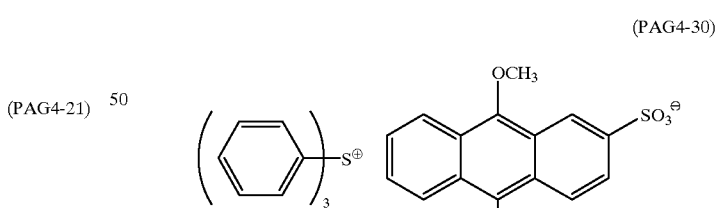
(PAG4-31)
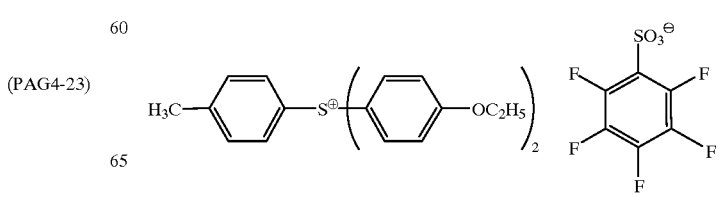

-continued (PAG4-32)

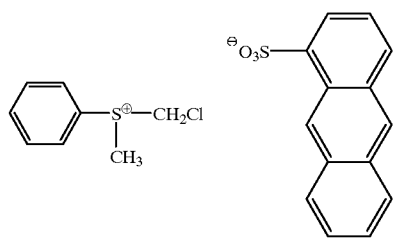

(PAG4-33)

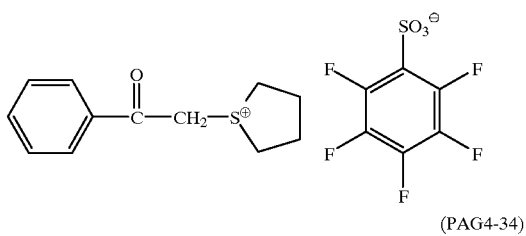

(PAG4-34)

(PAG4-35)

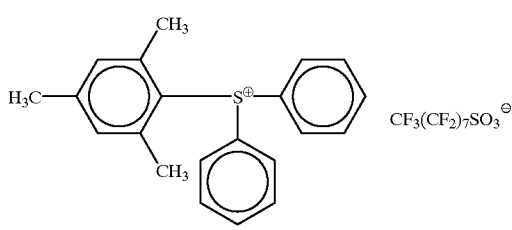

(PAG4-36)

(PAG4-37)

The onium salts represented by formulae (PAG3) and (PAG4) are known and can be synthesized by the methods described, for example, in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473 and JP-A-53-101331.

(3) Disulfone derivative represented by formula (PAG5) shown below or iminosulfonate derivative represented by formula (PAG6) shown below:

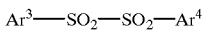
(PAG5)

(PAG6)

wherein $Ar^3$ and $Ar^4$, which may be the same or different, each represents a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group or a substituted or unsubstituted arylene group.

Specific examples thereof include the following compounds, however, the present invention should not be construed as being limited thereto.

(PAG5-1)

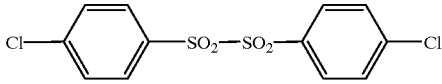

(PAG5-2)

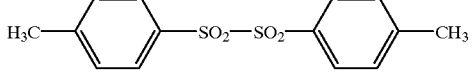

(PAG5-3)

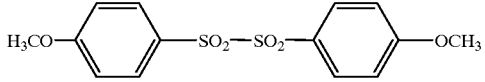

(PAG5-4)

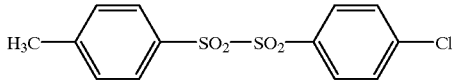

(PAG5-5)

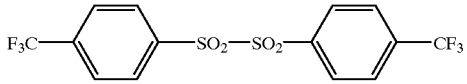

(PAG5-6)

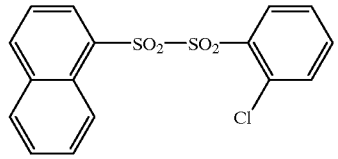

(PAG5-7)
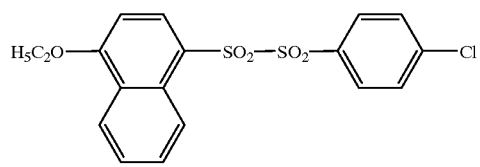
(PAG5-8)
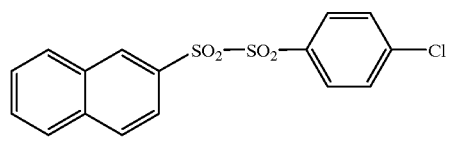
(PAG5-9)
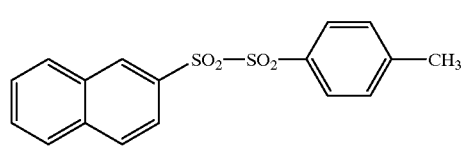
(PAG5-10)
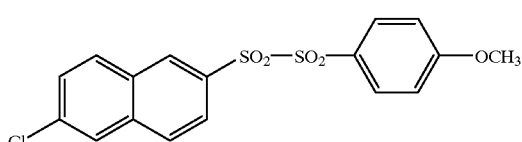
(PAG5-11)
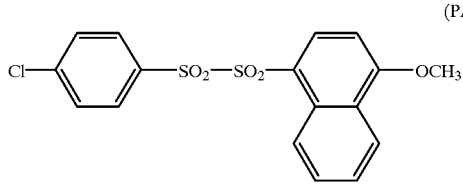
(PAG5-12)
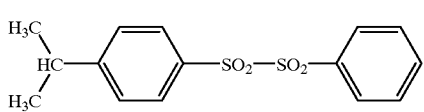
(PAG5-13)
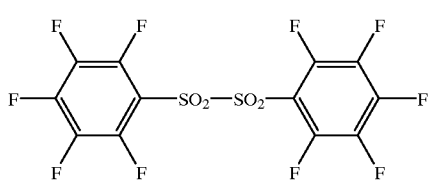
(PAG5-14)
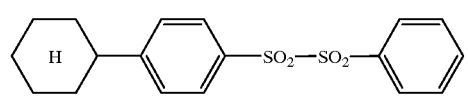
(PAG5-15)
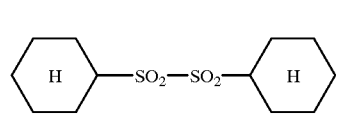
(PAG6-1)
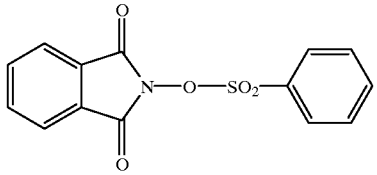
(PAG6-2)
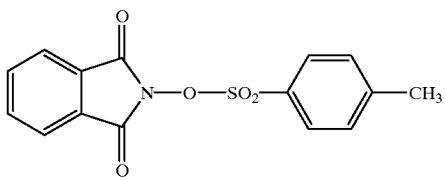
(PAG6-3)
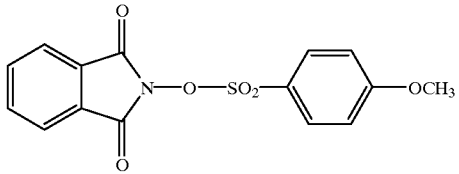
(PAG6-4)
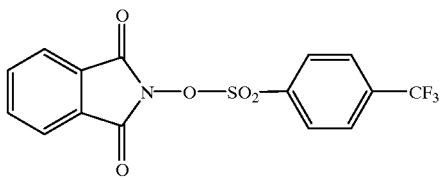
(PAG6-5)
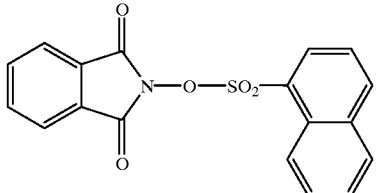
(PAG6-6)
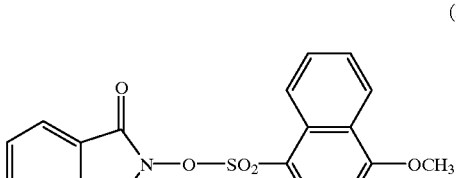
(PAG6-7)
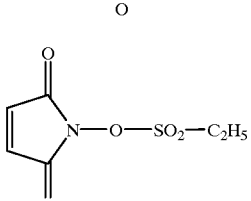
(PAG6-8)
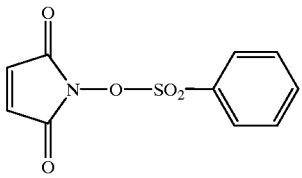

(PAG6-9) 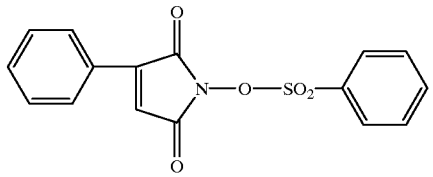

(PAG6-10) 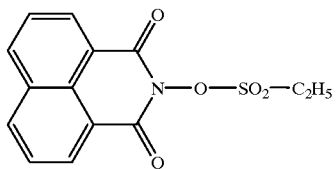

(PAG6-11) 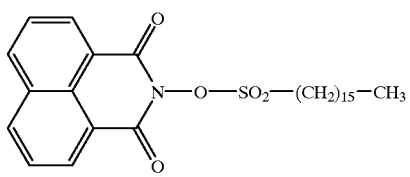

(PAG6-12) 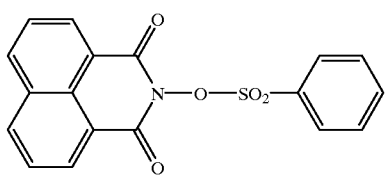

(PAG6-13) 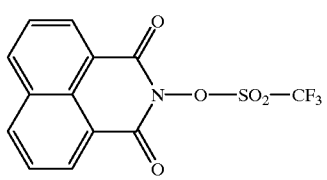

(PAG6-14) 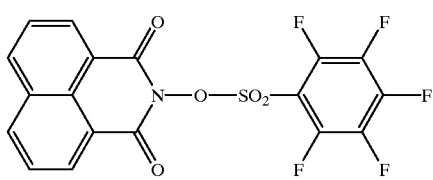

(PAG6-15) 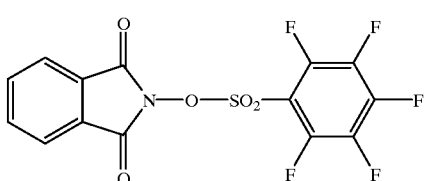

(PAG6-16) 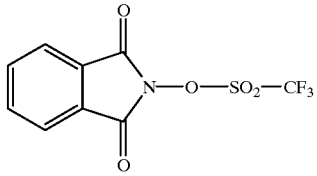

(PAG6-17) 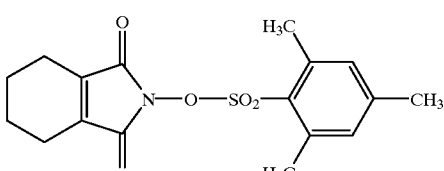

(PAG6-18) 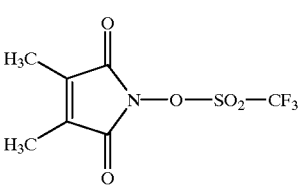

(PAG6-19) 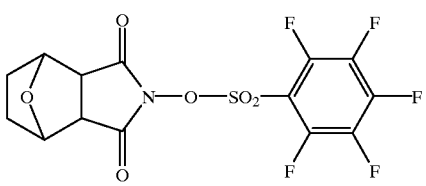

(4) Diazodisulfone derivative represented by formula (PAG7) shown below:

(PAG7)

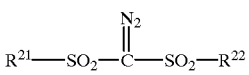

wherein $R^{21}$ and $R^{22}$, which may be the same or different, each represents a substituted or unsubstituted alkyl group, a cycloalkyl group or a substituted or unsubstituted aryl group.

Examples of the alkyl group include preferably a straight-chain or branched chain alkyl group having from 1 to 20 carbon atoms, more preferably a straight-chain or branched chain alkyl group having from 1 to 12 carbon atoms. Examples of the cycloalkyl group include preferably cyclopentyl and cyclohexyl groups. Examples of the aryl group include preferably an aryl group having from 6 to 10 carbon atoms which may be substituted. Examples of the substituent include an alkyl group such as methyl, ethyl, n-propyl, isopropyl, n-butyl, isobutyl, sec-butyl, tert-butyl, n-pentyl, n-hexyl, n-octyl, 2-ethylhexyl, nonyl, decyl and dodecyl groups, an alkoxy group such as methoxy, ethoxy, propoxy and butoxy groups, a halogen atom, a nitro group and an acetyl group.

Specific examples of the diazodisulfone derivative include the following compounds:
bis(methylsulfonyl)diazomethane,
bis(ethylsulfonyl)diazomethane,
bis(propylsulfonyl)diazomethane,
bis(1-methylpropylsulfonyl)diazomethane,
bis(butylsulfonyl)diazomethane,
bis(1-methylbutylsulfonyl)diazomethane,
bis(heptylsulfonyl)diazomethane,
bis(octylsulfonyl)diazomethane,
bis(nonylsulfonyl)diazomethane,
bis(decylsulfonyl)diazomethane,
bis(dodecylsulfonyl)diazomethane,
bis(trifluoromethylsulfonyl)diazomethane, bis(cyclohexylsulfonyl)diazomethane,
bis(benzylsulfonyl)diazomethane,
bis(2-chlorobenzylsulfonyl)diazomethane,
bis(4-chlorobenzylsulfonyl)diazomethane,
bis(phenylsulfonyl)diazomethane,
bis(4-methoxyphenylsulfonyl)diazomethane,
bis(2-methylphenylsulfonyl)diazomethane,
bis(3-methylphenylsulfonyl)diazomethane,
bis(4-methylphenylsulfonyl)diazomethane,
bis(2,4-dimethylphenylsulfonyl)diazomethane,
bis(2,5-dimethylphenylsulfonyl)diazomethane,
bis(3,4-dimethylphenylsulfonyl)diazomethane,
bis(2,4,6-trimethylphenylsulfonyl)diazomethane,
bis(4-fluorophenylsulfonyl)diazomethane,
bis(2,4-difluorophenylsulfonyl)diazomethane,
bis(2,4,6-trifluorophenylsulfonyl)diazomethane and
bis(4-nitrophenylsulfonyl)diazomethane.

(5) Diazoketosulfone derivative represented by formula (PAG8) shown below:

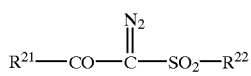

(PAG8)

wherein $R^{21}$ and $R^{22}$ each has the same meaning as defined in formula (PAG7) described above.

Specific examples of the diazoketosulfone derivative include the following compounds:
methylsulfonyl-benzoyl-diazomethane,
ethylsulfonyl-benzoyl-diazomethane,
methylsulfonyl-4-bromobenzoyl-diazomethane,
ethylsulfonyl-4-bromobenzoyl-diazomethane,
phenylsulfonyl-benzoyl-diazomethane,
phenylsulfonyl-2-methylphenyl-diazomethane,
phenylsulfonyl-3-methylphenyl-diazomethane,
phenylsulfonyl-4-methylphenyl-diazomethane,
phenylsulfonyl-3-methoxylphenyl-diazomethane,
phenylsulfonyl-4-methoxylphenyl-diazomethane,
phenylsulfonyl-3-chlorobenzoyl-diazomethane,
phenylsulfonyl-4-chlorophenyl-diazomethane,
tolylsulfonyl-3-chlorobenzoyl-diazomethane,
tolylsulfonyl-4-chlorobenzoyl-diazomethane,
phenylsulfonyl-4-fluorophenyl-diazomethane and
tolylsulfonyl-4-fluorophenyl-diazomethane.

Of the above-described compounds, those which decompose to generate an organic sulfonic acid upon irradiation with an actinic ray or radiation are preferably employed. The organic sulfonic acid is a sulfonic acid having an organic moiety. The organic moiety includes an alkyl group which may be substituted, a phenyl group which may be substituted and a naphthyl group which may be substituted. Examples of the substituent include a straight-chain or branched chain alkyl group having from 1 to 12 carbon atoms, an alkoxy group having from 1 to 6 carbon atoms and a halogen atom such as fluorine, chlorine, bromine and iodine atoms. Specific examples of the organic moiety include an alkyl group, e.g., methyl ethyl, n-propyl, isopropyl, n-butyl, isobutyl, tert-butyl, n-amyl, isoamyl, tert-amyl, sec-amyl, n-hexyl, n-heptyl, n-octyl, 2-ethylhexyl, nonyl, decyl and dodecyl groups, a substituted alkyl group, e.g., chloromethyl, dichloromethyl, trichloromethyl, chloroethyl, fluoromethyl, difluoromethyl, trifluoromethyl, perfluorobutyl and perfluorooctyl groups, a phenyl group, a substituted phenyl group, e.g., tolyl, dimethylphenyl, trimethylphenyl, methoxyphenyl, ethoxyphenyl, chlorophenyl, bromophenyl, iodophenyl, fluorophenyl and pentafluorophenyl groups, a naphthyl group, and a substituted naphthyl group, e.g., methylnaphthyl, methoxynaphthyl, chloronaphthyl, bromonaphthyl and iodonaphthyl groups. Of the organic moieties, those having a fluorine atom are particularly preferred.

In the present invention, an onium salt is preferably used as a photo-acid generator. Of the onium salts, sulfoninm salt compounds and iodonium salt compounds are preferred and specifically include those represented by formula (PAG3) or (PAG4) described above.

Of the compounds represented by formula (PAG3) or (PAG4), those having an alkyl group having 5 or more carbon atoms which may be substituted, a cycloalkyl group having 5 or more carbon atoms which may be substituted, an alkoxy group having 5 or more carbon atoms which may be substituted, an alkoxycarbonyl group having 5 or more carbon atoms which may be substituted, an acyl group having 5 or more carbon atoms which may be substituted or an acyloxy group having 5 or more carbon atoms which may be substituted as the substituent on a phenyl group in the cation portion are preferred. Photo-acid generators represented by formula (sI) or (sII) shown below are particularly preferred. Using such a photo-acid generator, number of particles just after the preparation of a photoresist composition solution is reduced and increase in the number of particles during preservation (with lapse of time) of the photoresist composition solution is restrained.

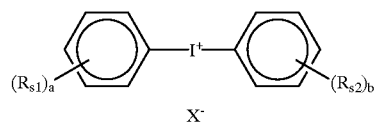

[sI]

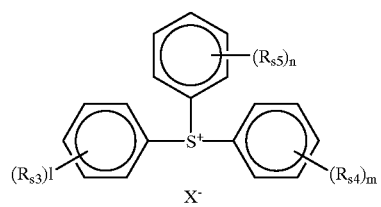

[sII]

wherein $R_{s1}$, $R_{s2}$, $R_{s3}$, $R_{s4}$ and $R_{s5}$, which may be the same or different, each represents a hydrogen atom, an alkyl group which may be substituted, a cycloalkyl group which may be substituted, an alkoxy group which may be substituted, an alkoxycarbonyl group which may be substituted, an acyl group which may be substituted, an acyloxy group which may be substituted, a nitro group, a halogen atom, a hydroxy group or a carboxy group, provided that at least one of R.,, and $R_{s2}$ represents an alkyl group having 5 or more carbon atoms which may be substituted, a cycloalkyl group having 5 or more carbon atoms which may be substituted, an alkoxy group having 5 or more carbon atoms which may be substituted, an alkoxycarbonyl group having 5 or more carbon atoms which may be substituted, an acyl group having 5 or more carbon atoms which may be substituted or an acyloxy group having 5 or more carbon atoms which may be substituted; a represents 1 to 5, b represents 1 to 5, 1 represents 1 to 5, m represents 0 to 5, n represents 0 to 5, provided that when 1+m+n=1, $R_{s3}$ represents an alkyl group which may be substituted, a cycloalkyl group which may be substituted, an alkoxy group which may be substituted, an alkoxycarbonyl group which may be substituted, an acyl group which may be substituted or an acyloxy group which may be substituted; and X represents R–SO$_3$ wherein R represents an aliphatic hydrocarbon group which may be substituted or an aromatic hydrocarbon group which may be substituted.

Examples of the alkyl group for each of $R_{s1}$ to $R_{s5}$ in formula (sI) or (sII) include an alkyl group having from 1 to 25 carbon atoms which may be substituted, e.g., methyl, ethyl, propyl, n-butyl, isobutyl, sec-butyl, tert-butyl, pentyl, hexyl, heptyl, octyl, tert-amyl, decyl, dodecyl and hexadecyl groups. Examples of the cycloalkyl group include a cycloalkyl group having from 3 to 25 carbon atoms which may be substituted, e.g., cyclopropyl, cyclopentyl, cyclohexyl cyclooctyl, cyclododecyl and cyclohexadecyl groups. Examples of the alkoxy group include an alkoxy group having from 1 to 25 carbon atoms which may be substituted, e.g., methoxy, ethoxy, propoxy, isopropoxy, n-butoxy, isobutoxy, sec-butoxy, tert-butoxy, pentyloxy, tert-amyloxy, n-hexyloxy, n-octyloxy and n-dodecyloxy groups.

Examples of the alkoxycarbonyl group include an alkoxycarbonyl group having from 2 to 25 carbon atoms which may be substituted, e.g., methoxycarbonyl, ethoxycarbonyl, propoxycarbonyl, isopropoxycarbonyl, n-butoxycarbonyl, isobutoxycarbonyl, sec-butoxycarbonyl, tert-butoxycarbonyl, pentyloxycarbonyl, tert-amyloxycarbonyl, n-hexyloxycarbonyl, n-octyloxycarbonyl and n-dodecyloxycarbonyl groups. Examples of the acyl group include an acyl group having from 1 to 25 carbon atoms which may be substituted, e.g., formyl, acetyl, butyryl, valeryl, hexanoyl, octanoyl, tert-butylcarboyl and tert-amylcarbonyl groups. Examples of the acyloxy group include an acyloxy group having from 2 to 25 carbon atoms which may be substituted, e.g., acetoxy, propionyloxy, butyryloxy, tert-butyryloxy, tert-valeryloxy, n-hexanecarbonyoxy, n-octanecarbonyloxy, n-dodecanecarbonyloxy and n-hexadecanecarbonyloxy groups. Examples of the halogen atom include fluorine, chlorine, bromine and iodine atoms.

Examples of the substituent for the groups described above include preferably an alkoxy group having from 1 to 4 carbon atoms, a halogen atom (e.g., fluorine, chlorine, bromine or iodine), an acyl group, an acyloxy group, a cyano group, a hydroxy group, a carboxy group, an alkoxycarbonyl group and a nitro group.

At least one of $R_{s1}$ and $R_{s2}$ represents an alkyl group having 5 or more carbon atoms which may be substituted, a cycloalkyl group having 5 or more carbon atoms which may be substituted, an alkoxy group having 5 or more carbon atoms which may be substituted, an alkoxycarbonyl group having 5 or more carbon atoms which may be substituted, an acyl group having 5 or more carbon atoms which may be substituted or an acyloxy group having 5 or more carbon atoms which may be substituted as described above.

Examples of the group having 5 or more carbon atoms include those having 5 to 25 carbon atoms described above.

Also, when 1+m+n=1, $R_{s3}$ represents an alkyl group which may be substituted, a cycloalkyl group which may be substituted, an alkoxy group which may be substituted, an alkoxycarbonyl group which may be substituted, an acyl group which may be substituted or an acyloxy group which may be substituted. The group for $R_{s3}$ has preferably 2 or more carbon atoms and more preferably 4 or more carbon atoms.

Examples of the alkyl group for each of $R_{s1}$ to $R_{s5}$ in formula (sI) or (sII) include preferably an alkyl group which may be substituted, e.g., methyl, ethyl, propyl, isopropyl, butyl, tert-butyl, n-pentyl, tert-amyl, n-hexyl, n-octyl and decyl groups. Examples of the cycloalkyl group include preferably a cycloalkyl group which may be substituted, e.g., cyclohexyl, cyclooctyl and cyclododecyl groups. Examples of the alkoxy group include preferably an alkoxy group which may be substituted, e.g., methoxy, ethoxy, isopropoxy, n-butoxy, sec-butoxy, tert-butoxy, pentyloxy, tert-amyloxy, n-hexyloxy, n-octyloxy and n-dodecyloxy groups. Examples of the alkoxycarbonyl group include preferably an alkoxycarbonyl group which may be substituted, e.g., methoxycarbonyl, ethoxycarbonyl, isopropoxycarbonyl, n-butoxycarbonyl, sec-butoxycarbonyl, tert-butoxycarbonyl, pentyloxycarbonyl, tert-amyloxycarbonyl, n-hexyloxycarbonyl, n-octyloxycarbonyl and n-dodecyloxycarbonyl groups. Examples- of the acyl group include preferably an acyl group which may be substituted, e.g., foryl, acetyl, butyryl, valeryl, hexanoyl, octanoyl, tert-butylcarboyl and tert-amylcarbonyl groups. Examples of the acyloxy group include preferably an acyloxy group which may be substituted, e.g., acetoxy, propionyloxy, butyryloxy, tert-butyryloxy, tert-valeryloxy, n-hexanecarbonyloxy and n-octanecarbonyloxy groups.

Examples of the alkyl group having 5 or more carbon atoms which may be substituted include preferably n-pentyl, tert-amyl, n-hexyl, n-octyl and decyl groups. Examples of the cycloalkyl group having 5 or more carbon atoms which may be substituted include preferably cyclohexyl, cyclooctyl and cyclododecyl groups. Examples of the alkoxy group having 5 or more carbon atoms which may be substituted include preferably pentyloxy, tert-amyloxy, hexyloxy, n-octyloxy and dodecyloxy groups. Examples of the alkoxycarbonyl group having 5 or more carbon atoms which may be substituted include preferably pentyloxycarbonyl, tert-amyloxycarbonyl, hexyloxycarbonyl, n-octyloxycarbonyl and dodecyloxycarbonyl groups. Examples of the acyl group having 5 or more carbon atoms which may be substituted include preferably valeryl, hexanoyl, octanoyl and tert-amylcarbonyl groups. Examples of the acyloxy group having 5 or more carbon atoms which may be substituted include preferably tert-valeryloxy, n-hexanecarbonyloxy and n-octanecarbonyloxy groups.

Examples of the substituent for these groups include preferably methoxy, ethoxy, tert-butoxy, cyano, hydroxy, methoxycarbonyl, ethoxycarbonyl, tert-butoxycarbonyl and tert-amyloxycarbonyl groups, and chlorine and bromine atoms.

The iodinium salt compound and sulfonium salt compound represented by formulae (sI) and (sII) for use in the present invention include a sulfonic acid having the specific structure described above as the counter anion represented by X—.

The aliphatic hydrocarbon group which may be substituted for R in the counter anion includes a straight-chain or branched chain alkyl group having from 1 to 20 carbon atoms which may be substituted or a cyclic alkyl group which may be substituted. R also represents an aromatic group which may be substituted.

Examples of the alkyl group for R include an alkyl group having from 1 to 20 carbon atoms, e.g., methyl, ethyl, propyl, n-butyl, n-pentyl, n-hexyl, n-octyl, 2-ethylhexyl, decyl and dodecyl groups which may be substituted. Examples of the cyclic alkyl group for R include, e.g., cyclopentyl, cyclohexyl, cyclooctyl, cyclododecyl, adamantyl, norbornyl, camphyl trocyclodecanyl and menthyl groups which may be substituted. Examples of the aromatic group for R include, e.g., phenyl and naphthyl groups which may be substituted.

Specific examples of the alkyl group which may be substituted for R include methyl, trifluoromethyl, ethyl, pentafluoroethyl, 2,2,2-trifluoroethyl, n-propyl, n-butyl, nonafluorobutyl, n-pentyl, n-hexyl, n-octyl, heptadecafluorooctyl, 2-ethylhexyl, docyl and dodecyl groups. Specific examples of the cyclic alkyl group which may be substituted for R include cyclopentyl, cyclohexyl and camphyl groups. Specific examples of the aromatic group which may be substituted for R include phenyl, naphthyl, pentafluorophenyl, p-tolyl, P-fluorophenyl, p-chlorophenyl, p-hydroxyphenyl, p-methoxyphenyl, dodecylphenyl, mesityl, triisopropylphenyl, 4-hydroxy-1-naphthyl and 6-hydroxy-2-naphthyl groups.

More preferred examples of the substituent for each of $R_{s1}$ to $R_{s5}$ include specifically methyl, ethyl, propyl, isopropyl, n-butyl, tert-butyl, n-pentyl, tert-amyl, n-hexyl, n-octyl, cyclohexyl, methoxy, ethoxy, isopropoxy, n-butoxy, tert-butoxy, pentyloxy, tert-amyloxy, hexyloxy, n-octyloxy, methoxycarbonyl, ethoxycarbonyl, n-butoxycarbonyl, tert-butoxycarbonyl, tert-amyloxycarbonyl, hexyloxycarbonyl, n-octyloxycarbonyl, formyl, acetyl, butyryl, hexanoyl, octanoyl, tert-butylcarbonyl, tert-amylcarbonyl, acetoxy, propionyloxy, butyryloxy, tert-butyryloxy, tert-valeryloxy, n-hexanecarbonyloxy, n-octanecarbonyloxy, hydroxy and nitro groups, and chlorine and bromine atoms.

More preferred examples of the group having 5 or more carbon atoms include specifically n-pentyl, tert-amyl, n-hexyl, n-octyl, decyl, cyclohexyl, pentyloxy, tert-amyloxy, hexyloxy, n-octyloxy, dodecyloxy, pentyloxycarbonyl, tert-amyloxycarbonyl, hexyloxycarbonyl, n-octyloxycarbonyl, dodecyloxycarbonyl, valeryl, hexanoyl, octanoyl, tert-amylcarbonyl, tert-valeryloxy, n-hexanecarbonyloxy and n-octanecarbonyloxy group.

More preferred examples of the substituent represented by R in the sulfonic acid include specifically methyl, trifluoromethyl, ethyl, pentafluoroethyl, 2,2,2-trifluoroethyl, n-butyl, nonafluorobutyl, n-hexyl, n-octyl, heptadecafluorooctyl, 2-ethylhexyl, camphyl, phenyl, naphthyl, pentafluorophenyl, p-tolyl, P-fluorophenyl, p-chlorophenyl, p-methoxyphenyl, dodecylphenyl mesityl, triisopropylphenyl, 4-hydroxy-1-naphthyl and 6-hydroxy-2-naphthyl groups.

The total number of carbon atoms in the acid generated is preferably from 1 to 30, more preferably from 1 to 28, and still more preferably from 1 to 25. When the total number thereof is less than 1, pattern profile may be adversely affected so as to form a T-top profile. On the other hand, if it exceeds 30, undesirable development residue may occur.

Specific examples of the compound represented by formula (sI) or (sII) are set forth below as [sI-1] to [sI-18] and [sII-1] to [sII-20], but the present invention should not be construed as being limited thereto. These compounds can be used individually or in combination of two or more thereof.

[sI-1]

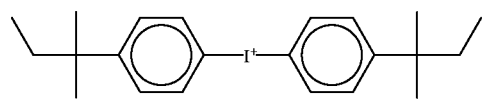

[sI-2]

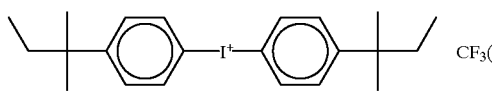

[sI-3]

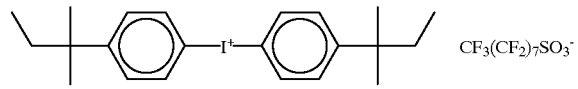

[sI-4]

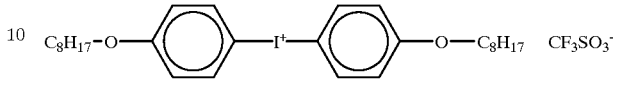

[sI-5]

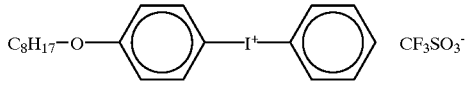

[sI-6]

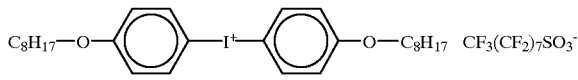

[sI-7]

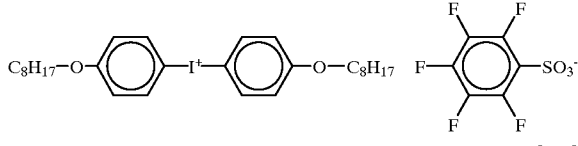

[sI-8]

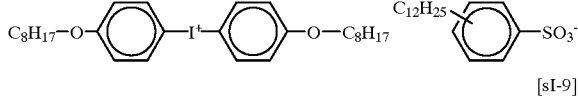

[sI-9]

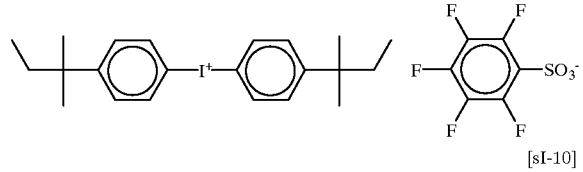

[sI-10]

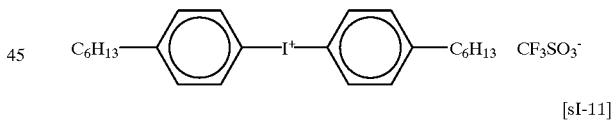

[sI-11]

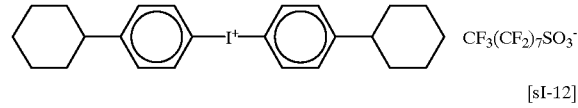

[sI-12]

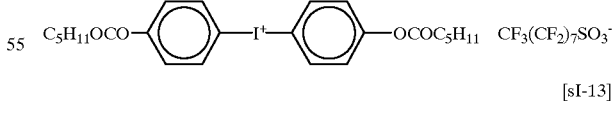

[sI-13]

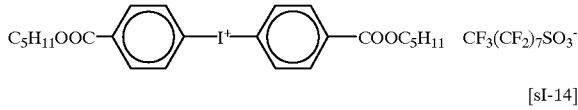

[sI-14]

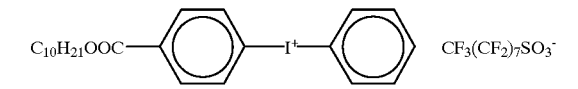

[sI-15]
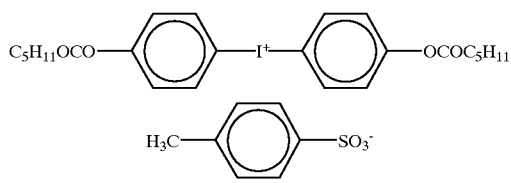
[sI-16]
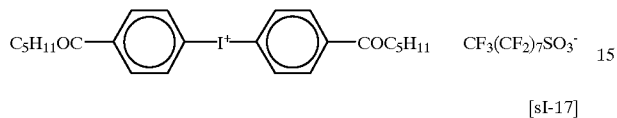
[sI-17]
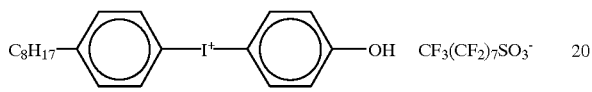
[sI-18]
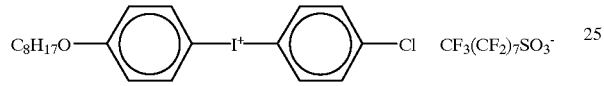
[sII-1]
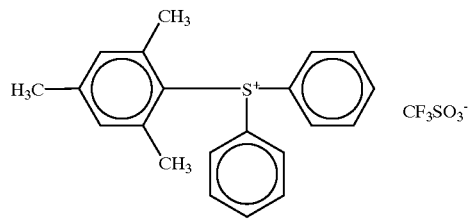
[sII-2]
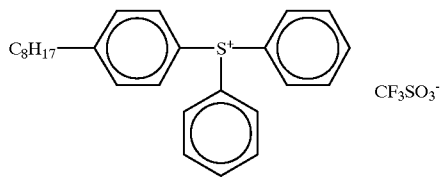
[sII-3]
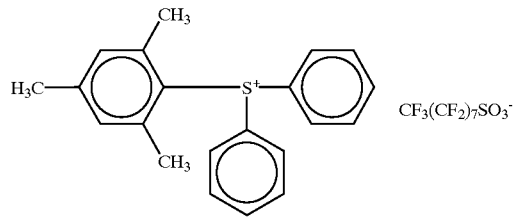
[sII-4]
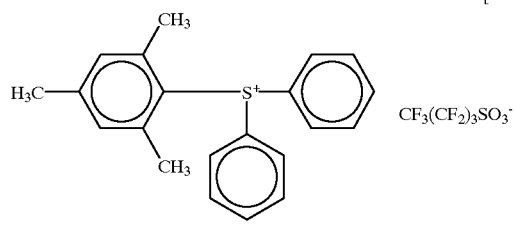
[sII-5]
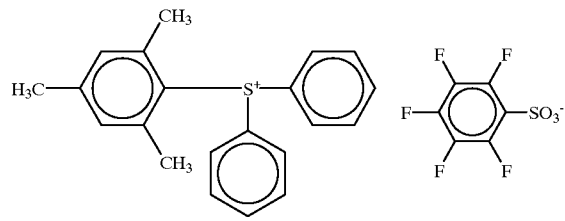
[sII-6]
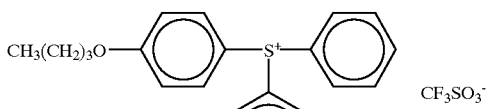
[sII-7]
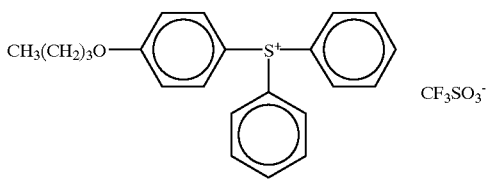
[sII-8]
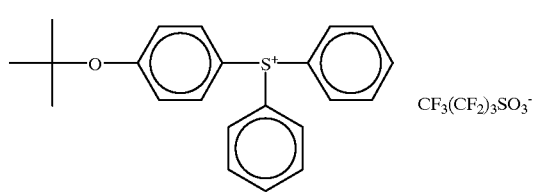
[sII-9]
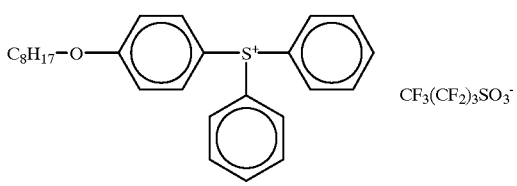
[sII-10]
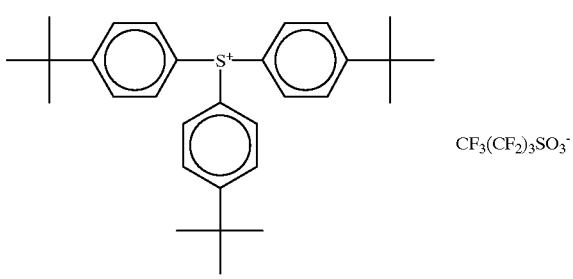
[sII-11]
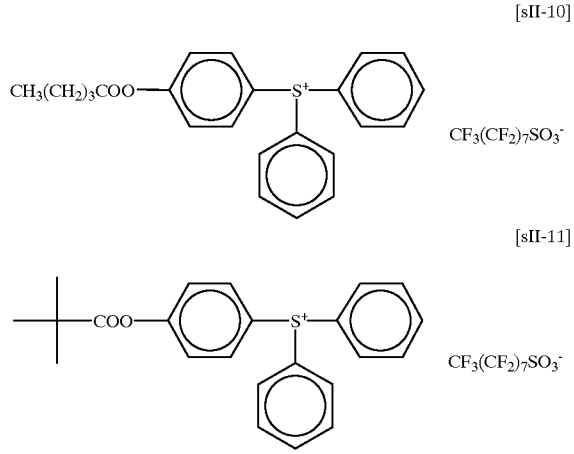

[sII-12]

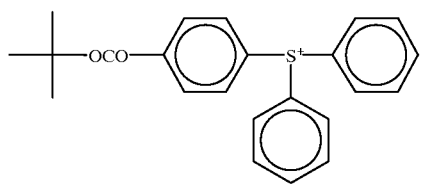

[sII-13]

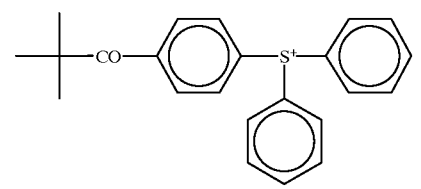

[sII-14]

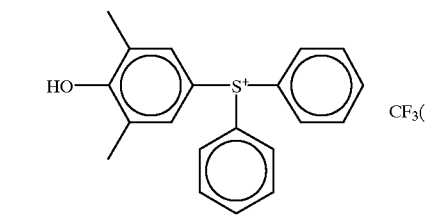

[sII-15]

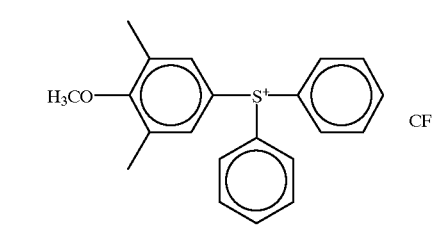

[sII-16]

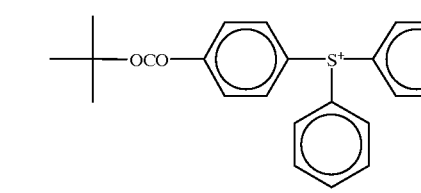

[sII-17]

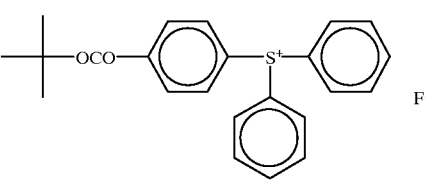

[sII-18]

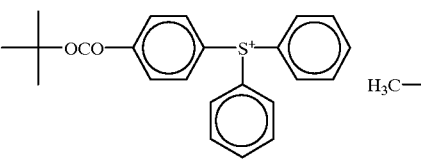

[sII-19]

[sII-20]

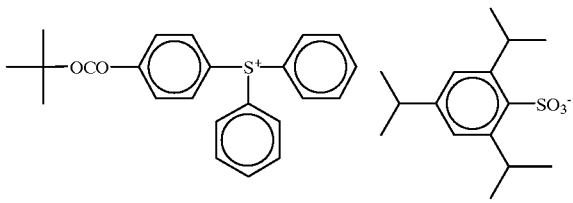

The compound represented by formula (sI) or (sII) can be synthesized, for example, by reacting the corresponding chloride compound (compound in which the counter anion of $X^-$ in formula (sI) or (sII) is substituted with $Cl^-$) with a compound represented by $X^- Y^+$ (wherein X- has the same meaning as defined in formula (sI) or (sII) and $Y^+$ represents a cation such as $H^+$, $Na^+$, $K^+$, $NH_4^+$ or $N(CH_3)_4^+$) in an aqueous solution to conduct salt exchange. The corresponding hydroxide or methanesulfonate compound is also used in place of the chloride compound described above.

The amount of the compound which decomposes to generate an acid upon irradiation with an actinic ray or radiation (photo-acid generator) of (B) to be used is usually from 0.001 to 40% by weight, preferably from 0.01 to 20% by weight, and more preferably from 0.1 to 10% by weight, based on the total amount (excluding a solvent for coating) of the positive photoresist composition of the present invention. If the amount of the photo-acid generator used is less than 0.001% by weight, sensitivity of the resist composition increases, whereas if the amount used exceeds 40% by weight, the resist exhibits too much light absorption, resulting in causing disadvantageous problems such as deterioration of profile or narrow process (particularly bake) margin.

It is preferred that the positive photoresist composition of the present invention contains a surface active agent. By using the surface active agent, pitch dependency (iso/dense bias) is improved.

The surface active agent includes a fluorine-base surface active agent, a silicon-base surface active agent, a surface active agent having both a fluorine atom and a silicon, and a nonionic surface active agent. Particularly, the fluorine-base surface active agent, silicon-base surface active agent and surface active agent having both a fluorine atom and a silicon are preferred.

Examples of the surface active agent include those described, for example, in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988. Commercially available surface active agents shown below are also employed as they are.

Examples of the commercially available surface active agent which can be used include fluorine-base surface active agents and silicon-base surface active agents, for example, Eftop EF301 and EF303 (manufactured by Shin Akita Chemical Co., Ltd.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, SC102, SC103, SC104, SC105 and SC106 (manufactured by Asahi Glass Co., Ltd.), and Troysol S-366 (manufactured by Troy Chemical Co., Ltd.). Also, polysiloxane polymer KP-341 (manufactured by Shin-Etsu Chemical Co., Ltd.) is employed as the silicon-base surface active agent.

Specific examples of other surface active agents include a nonionic surface active agent, for example, a polyoxyethylene alkyl ether such as polyoxyethylene lauryl ether, polyoxyethylene stearyl ether, polyoxyethylene cetyl ether and polyoxyethylene oleyl ether, a polyoxyethylene alkylaryl ether such as polyoxyethylene octylphenyl ether and polyoxyethylene nonylphenyl ether, a polyoxyethylene/ polyoxypropylene block copolymer, a sorbitan fatty acid ester such as sorbitan monolaurate, sorbitan monopalmitate, sorbitan monostearate, sorbitan monooleate, sorbitan trioleate and sorbitan tristearate, and a polyoxyethylene sorbitan fatty acid ester such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

The amount of surface active agent used is ordinarily from 0.001 to 2% by weight, preferably from 0.01 to 1% by weight, based on the solid content of the photoresist composition of the present invention.

The surface active agents may be used individually or in combination of two or more thereof.

It is preferred that the positive photoresist composition of the present invention contains an organic basic compound. By using the organic basic compound, variation in sensitivity is restrained.

Suitable examples of the organic basic compound include compounds having a structure represented by formula (A), (B), (C), (D) or (E) shown below.

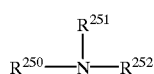

(A)

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbons atoms, or $R^{251}$ and $R^{252}$ may be combined with each other to form a ring;

(B)

(C)

(D)

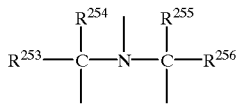

(E)

wherein $R^{253}$, $R^{254}$, $R^{255}$ and $R^{256}$, which may be the same or different, each represents an alkyl group having from 1 to 6 carbon atoms.

A nitrogen-containing basic compound having two or more nitrogen atoms of different chemical environment in its molecule is preferred. A compound having both a substituted or unsubstituted amino group and a ring structure containing a nitrogen atom and a compound having an alkylamino group are particularly preferred.

Preferred examples of the nitrogen-containing basic compound include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, a substituted or unsubstituted aminoalkylmorpholine. Examples of the substituent include preferably an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Specific examples of the compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-amino-ethylpyridine, 4-aminoethylpyridine, 3-aminopyrrolidine, piperazine, N-(2-aminoethyl)piperazine, N-(2-aminoethyl)-piperidine, 4-amino-2,2,6,6-tetramethylpiperidine, 4-piperidinopiperidine, 2-iminopiperidine, 1-(2-aminoethyl)-pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diaza-bicyclo[4,3,0]non-5-ene, 1,8-diazabicyclo[5,4,0]undec-7-ene, 2,4,5-triphenylimidazole, N-methylmorpholine, N-ethylmorpholine, N-hydroxyethylmorpholine, N-benzylmorpholine, a tertiary morpholine derivative such as cyclohexyl morpholinoethyl thiourea (CHMETU), and a hindered amine as described in paragraph [0005] of JP-A-11-52575. However, the present invention should not be construed as being limited thereto.

Of the these compounds, 1,5-diazabicyclo[4,3,0]non-5-ene, 1,8-diazabicyclo[5,4,0]undec-7-ene (DBU), 1,4-diazabicyclo[2,2,2]octane, 4-dimethylaminopyridine, hexamethylenetetramine, 4,4-dimethylimidazoline, a pyrrole, a pyrazole, an imidazole, a pyridazine, a pyrimidine, a tertiary morpholine such as CHMETU and a hindered amine such as bis(1,2,2,6,6-pentamethyl-4-piperidyl) sebacate are particularly preferred.

Particularly, 1,5-diazabicyclo[4,3,0]non-5-ene, 1,8-diazabicyclo[5,4,0]undec-7-ene, 1,4-diazabicyclo[2,2,2]octane, 4-dimethylaminopyridine, hexamethylenetetramine, CHMETU and bis(1,2,2,6,6-pentamethyl-4-piperidyl) sebacate are preferred.

The organic basic compounds may be used individually or in combination of two or more thereof.

The amount of the organic basic compound used is ordinarily from 0.001 to 10% by weight, preferably from 0.01 to 5% by weight, based on the solid content of the photoresist composition. If the amount of the organic basic compound used is less than 0.001% by weight, the effect owing to the addition of the organic basic compound may not be obtained, whereas if it exceeds 10% by weight, decrease in sensitivity or deterioration in developing property of the unexposed area is liable to occur.

The positive photoresist composition of the present invention is dissolved in an appropriate solvent for coating. Examples of the solvent include a propylene glycol monoalkyl ether acetate such as propylene glycol monomethyl ether acetate and propylene glycol monoethyl ether acetate, an alkyl ester of lactic acid such as metyl lactate and ethyl lactate, a propylene glycol monoalkyl ether such as propylene glycol monomethyl ether and propylene glycol monoethyl ether, an ethylene glycol monoalkyl ether such as ethylene glycol monomethyl ether and ethylene glycol monoethyl ether, an ethylene glycol monoalkyl ether acetate such as ethylene glycol monomethyl ether acetate and ethylene glycol monoethyl ether acetate, 2-heptanone, γ-butyrolactone, an alkyl ester of alkoxypropionic acid such as methyl methoxypropionate and ethyl ethoxypropionate, an alkyl ester of pyruvic acid such as metyl pyruvate and ethyl pyruvate, N-methylpyrrolidone, N,N-dimetylacetamide and dimethyl sulfoxide. The solvents may be used individually or in combination of two or more thereof.

The positive photoresist composition of the present invention may further contain other ingredients, for example, an acid-decomposable dissolution inhibiting compound, a dye, a plasticizer, a surface active agent other than those described above, a photosensitizer and a compound which accelerates dissolution in a developing solution, if desired.

The positive photoresist composition according to the present invention is applied to a substrate to form a thin coating. A thickness of the coating is preferably from 50 nm to 1,500 nm.

The positive photoresist composition of the present invention is coated on a substrate (e.g., silicon/silicon dioxide coating) for use in the production of a precision integrated circuit element by an appropriate coating means such as a spinner or coater, exposed through a prescribed mask, baked and developed to thereby obtain a good resist pattern.

Preferred examples of the exposure light include a far ultraviolet ray having a wavelength of 250 nm and shorter, more preferably 220 nm and shorter. Specific examples thereof include a KrF excimer laser beam (248 nm), an ArF excimer laser beam (193 nm), an $F_2$ excimer laser beam (157 nm), an X-ray and an electron beam. The ArF excimer laser beam (193 nm) is particularly preferred.

As a developing solution for the positive photoresist composition suitable for far ultraviolet ray of the present invention, an alkaline aqueous solution of an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroixde or tetraethylammonium hydroixde, or a cyclic amine, e.g., pyrrole or piperidine can be employed.

The alkaline aqueous solution for use as the developing solution may contain an appropriate amount of an alcohol or a surface active agent.

When the positive photoresist composition of the present invention is employed as an upper-layer resist of two-layer resists, a lower-layer organic polymer film is etched by oxygen plasma using an upper-layer resist pattern as a protective mask. The upper-layer resist according to the present invention has sufficient resistance against oxygen plasma. While the oxygen plasma resistance of the positive photoresist composition of the present invention may be varied depending on a silicon content of the upper-layer resist, an etching apparatus and etching conditions, an etching selectivity ratio (an etching speed ratio of the lower-layer organic polymer film to the upper-layer resist) can be selected within a range so sufficiently wide as 10 to 100.

In a pattern formation method using the positive photoresist composition of the present invention, an organic polymer film is first formed on a substrate to be processed. The organic polymer film may be formed from any of various known photoresists which include, for example, photoresists of FH series and FHi series (manufactured by Fuji Film Olin Co., Ltd.) and photoresists of PFI series (manufactured by Sumitomo Chemical Co., Ltd.). The organic polymer film is formed by dissolving any of such photoresists in an appropriate solvent and applying the resulting solution to a substrate by a spin coating method or a spray method. Then, a film of the positive photoresist composition of the present invention is formed on the first layer of the above-described organic polymer. The film formation is conducted in a manner similar to the formation of the first layer by dissolving the resist material in an appropriate solvent and applying the resulting solution by a spin coating method or a spray method.

The two-layer resists obtained are then subjected to a pattern formation process. As the first step thereof, pattern formation treatment is conducted to the second layer, that is, the upper-layer film of the photoresist composition. Mask alignment is carried out, if desired, and the upper-layer is irradiated with a high-energy ray through the mask thereby making an irradiated portion of the photoresist composition soluble in an aqueous alkaline solution, followed by development with the aqueous alkaline solution to form a pattern.

Subsequently, the organic polymer film is etched as the second step. The process is conducted by oxygen plasma etching using the pattern of the resist composition film as a mask to form a fine pattern having a high aspect ratio. The etching of the organic polymer film by the oxygen plasma etching is a technique quite similar to plasma ashing utilized for stripping of a resist film carried out after the termination of etching process of a substrate according to a conventional photo-etching process. For example, the operation can be conducted using a reactive gas, i.e., an oxygen gas, as an etching gas in a cylindrical plasma etching apparatus or a parallel flat plate plasma etching apparatus.

Then, the substrate is subjected to processing using the resist pattern as a mask. For the processing of substrate, a dry etching method such as sputter etching, gas plasma etching or ion beam etching is utilized.

The etching treatment in the two-layer resist method including the resist film of the present invention is completed by the stripping operation of the resist film. The stripping of the resist film can be carried out only by dissolution treatment of organic polymer material of the first layer. Since the organic polymer material is an optional photoresist and it is not changed in quality (e.g. cured) by the above photo-etching process, a known organic solvent for the photoresist itself can be used. The stripping of resist can also be performed by treatment such as plasma etching without using a solvent.

The positive photoresist composition of the present invention provides a resist pattern in which variation of linewidth is suppressed when the resist pattern formed in the production of semiconductor device is observed by a scanning electron microscope (SEM).

The present invention will be described in greater detail with reference to the following examples, but the present invention should not be construed as being limited thereto.

<Synthesis of Photo-Acid Generator>

SYNTHESIS EXAMPLE 1

Synthesis of Photo-Acid Generator [sI-3]

To a mixture of 60 g of tert-amylbenzene, 39.5 g of potassium iodate, 81 g of acetic anhydride and 170 ml of dichloromethane was dropwise added 66.8 g of concentrated sulfuric acid while cooling with an ice bath over a period of 2 hours. The reaction solution was stirred as it was for 2 hours and then stirred at a room temperature overnight to complete the reaction.

After the completion of the reaction, 50 ml of distilled water was dropwise added to the reaction solution while cooling with an ice bath. The mixture was extracted and the organic layer was washed with water, an aqueous sodium bicarbonate solution and water, and concentrated to obtain 40 g of di(tert-amylphenyl)iodonium sulfate.

The resulting sulfate was subjected to salt exchange with potassium heptadecafluorooctanesulfonate to obtain the desired compound, i.e., Photo-Acid Generator [sI-3].

SYNTHESIS EXAMPLE 2

Synthesis of Photo-Acid Generator [sI-6]

To a mixture of 90 g of n-octyl phenyl ether, 39.5 g of potassium iodate, 81 g of acetic anhydride and 180 ml of dichloromethane was dropwise added 66.8 g of concentrated sulfuric acid while cooling with an ice bath over a period of 2 hours. The reaction solution was stirred as it was for 2 hours and then stirred at a room temperature overnight to complete the reaction.

After the completion of the reaction, 50 ml of distilled water was dropwise added to the reaction solution while cooling with an ice bath. The mixture was extracted and the organic layer was washed with water, an aqueous sodium bicarbonate solution and water, and concentrated to obtain 45 g of di(n-octyloxyphenyl)iodonium sulfate.

The resulting sulfate was subjected to salt exchange with potassium heptadecafluorooctanesulfonate to obtain the desired compound, i.e., Photo-Acid Generator [sI-6].

SYNTHESIS EXAMPLE 3

Synthesis of Photo-Acid Generator [sI-9]

The di(tert-amylphenyl)iodonium sulfate obtained in Synthesis Example 1 was subjected to salt exchange with sodium pentafluorobenzenesulfonate to obtain the desired compound, i.e., Photo-Acid Generator [sI-9].

SYNTHESIS EXAMPLE 4

Synthesis of Photo-Acid Generator [sI-5]

To 40 g of iodobenzene was gradually added 91 g of peracetic acid and the resulting solution was stirred at 30° C. for 2 hours. When the deposition of white powder was observed, the reaction mixture was cooled with ice, and the deposit was collected by filtration to obtain 38 g of iodosobenzenediacetate.

To a mixture of 50 g of iodosobenzenediacetate obtained above, 30 g of octyl phenyl ether, 70 g of acetic anhydride and 725 ml of glacial acetic acid was dropwise added 8 g of concentrated sulfuric acid while cooling with an ice bath over a period of one hour. One hour after, a solution containing 31 g of sodium bromide dissolved in 150 ml of water was dropwise added thereto and the white powder thus-deposited was collected to obtain 42 g of iodonium bromide salt.

The iodonium bromide salt was subjected to salt exchange with trifluoromethanesulfonate to obtain the desired compound, i.e., Photo-Acid Generator [sI-5].

SYNTHESIS EXAMPLE 5

Synthesis of Photo-Acid Generator [sII-3]

In 800 ml of mesitylene was dissolved 50 g of diphenylsulfoxide, and to the solution was added 200 g of aluminum chloride. The mixture was stirred at 80° C. for 24 hours. After the completion of the reaction, the reaction solution was gradually poured into 2 liters of ice. Then, 400 ml of concentrated hydrochloric acid was added thereto and the mixture was heated at 70° C. for 10 minutes. The reaction solution was then cooled to a room temperature, washed with ethyl acetate and filtered. To the filtrate was added a solution containing 200 g of ammonium iodide dissolved in 400 ml of distilled water. The powder thus-deposited was collected by filtration, washed with water and then ethyl acetate, and dried to obtain 72 g of sulfonium iodide.

In 300 ml of methanol was dissolved 50 g of the sulfonium iodide thus-obtained and to the solution was added 31 g of silver oxide, followed by stirring for 4 hours. The reaction solution was filtered and subjected to salt exchange with potassium heptadecafluorooctanesulfonate to obtain 40 g of the desired compound, i.e., Photo-Acid Generator [sII-3].

SYNTHESIS EXAMPLE 6

Synthesis of Photo-Acid Generator [sII-2]

The corresponding sulfonium iodide was synthesized using octylbenzene in place of the mesitylene used in Synthesis Example 5 in the same manner as in Synthesis Example 5. Then, the sulfonium iodide was subjected to salt exchange with potassium trifluoromethanesulfonate in the same manner as in Synthesis Example 5 to obtain the desired compound, i.e., Photo-Acid Generator [sII-2].

SYNTHESIS EXAMPLE 7

Synthesis of Photo-Acid Generator [sII-8]

The corresponding sulfonium iodide was synthesized using octyloxybenzene in place of the mesitylene used in Synthesis Example 5 in the same manner as in Synthesis Example 5. Then, the sulfonium iodide was subjected to salt exchange with potassium nonafluorobutanesulfonate in the same manner as in Synthesis Example 5 to obtain the desired compound, i.e., Photo-Acid Generator [sII-8].

SYNTHESIS EXAMPLE 8

Synthesis of Photo-Acid Generator [sII-14]

To 50 g of diphenylsulfoxide and 45 g of 2,6-xylenol was added 100 ml of a solution of methanesulfonic acid/diphosphorus pentaoxide (10/1). After the completion of heat generation, the mixture was heated at 50° C. for 4 hours. After the completion of the reaction, the reaction solution was poured into ice. The resulting aqueous solution was washed with toluene and filtered. To the filtrate was added a solution containing 200 g of ammonium iodide dissolved in 400 ml of distilled water. The powder thus-deposited was collected by filtration, washed with water and dried to obtain sulfonium iodide.

In 300 ml of methanol was dissolved 50 g of the sulfonium iodide thus-obtained and to the solution was added 31 g of silver oxide, followed by stirring for 4 hours. The reaction solution was filtered and subjected to salt exchange with potassium heptadecafluorooctanesulfonate to obtain 43 g of the desired compound, i.e., Photo-Acid Generator [sII-14].

<Synthesis of Resin>

SYNTHESIS EXAMPLE 1R

Synthesis of Resin (1)

Allyltrimethylsilane, tert-butyl norbornene-carboxylate and maleic anhydride were put into a reaction vessel in a molar ratio of 20/30/50 and dissolved in tetrahydrofuran to prepare a solution having a solid content of 70% by weight, and the solution was heated at 60° C. under a nitrogen gas stream. After the reaction temperature was stabilized, 2% by mole of a radical initiator (V-601 manufactured by Wako Pure Chemical Industries, Ltd.) was added to initiate a reaction. After heating for 15 hours, the reaction mixture was diluted twice with tetrahydrofuran and poured into a large amount of hexane to deposit white powder. The white powder thus-deposited was collected by filtration and dried to obtain the desired resin, i.e., Resin (1).

A weight average molecular weight of Resin (1) obtained was measured by GPC and calculated in terms of polystyrene, and it was found to be 7,400. From the NMR spectrum of Resin (1), it was found that a molar ration of allyltrimethylsilane/tert-butylnorbornenecarboxylate/maleic anhydride in the resin was 26/24/50.

Resins (2) to (9) were synthesized in the same manner as in Synthesis Example 1R above, respectively.

The repeating units of Resins (1) to (9) are shown below and a molar ratio of the repeating units and a weight average molecular weight of each of the resins are described in Table 1 below.

TABLE 1

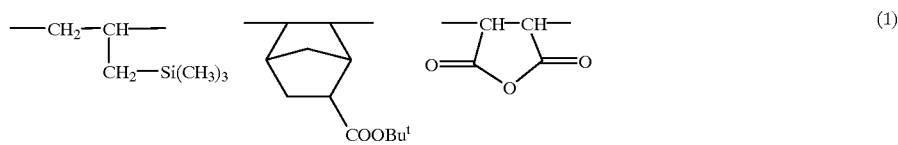

(1)

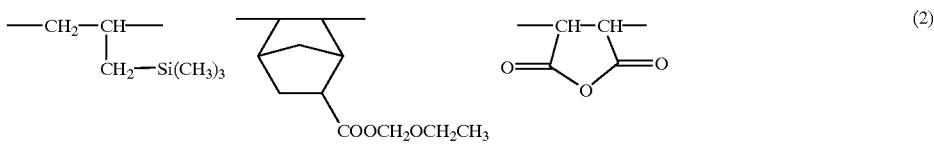

(2)

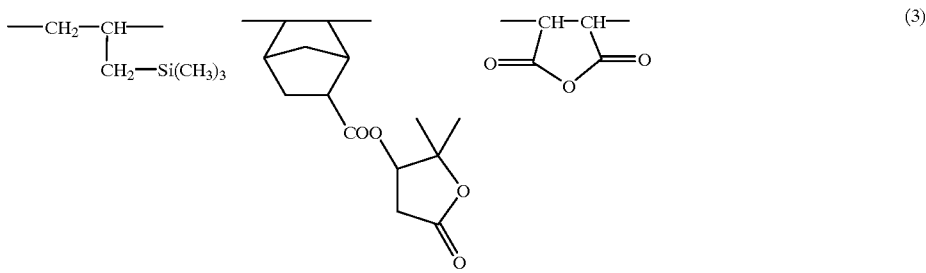

(3)

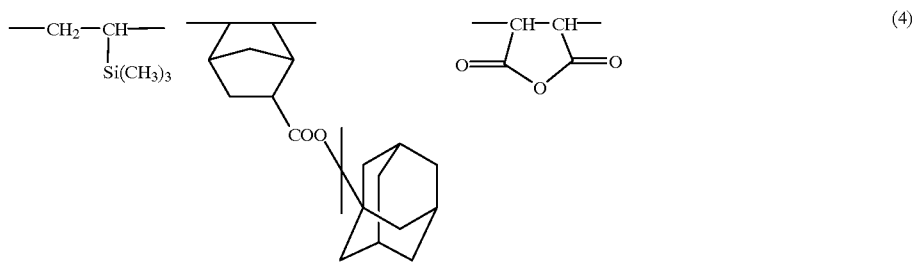

(4)

TABLE 1-continued
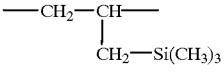
| Resin | (I) | (II)-1 | (II)-2 | Acid Anhydride | Mw |
|---|---|---|---|---|---|
| 2 | 25 | 25 | — | 50 | 8,300 |
| 3 | 27 | 23 | — | 50 | 8,500 |
| 4 | 24 | 26 | — | 50 | 9,100 |
| 5 | 23 | 10 | 17 | 50 | 8,700 |
| 6 | 12 | 24 | 14 | 50 | 6,700 |
| 7 | 10 | 26 | 14 | 50 | 5,800 |
| 8 | 9 | 29 | 12 | 50 | 5,300 |
| 9 | 10 | 18 | 22 | 50 | 5,400 |

EXAMPLES 1 TO 18

<Preparation and Evaluation of Positive Photoresist Composition>

A mixture of 2 g of each of the resins synthesized in Synthesis Examples described above and shown in Table 2 below, 120 mg of each of the photo-acid generators shown in Table 2 below, 8 mg of each of the organic basic compounds shown in Table 2 below and 5 mg of each of the surface active agent shown in Table 2 below was dissolved in propylene glycol monomethyl ether acetate (PGMEA) in such a proportion as to result in a solid content of 10% by weight The resulting solution was filtered through a 0.1-$\mu$m microfilter to prepare a positive photoresist composition solution for Examples 1 to 18.

An FHi-028D resist (resist for i-line manufactured by Fuji Film Olin Co., Ltd.) was applied to a silicon wafer by a coater (CDS-650 manufactured by Canon Inc.) and baked at 90° C. for 90 seconds to obtain an uniform film having a thickness of 0.83 $\mu$m. The resist film was further heated at 200° C. for 3 minutes and the thickness of the resist film was reduced to 0.71 $\mu$m. The positive photoresist composition solution prepared above was applied to the film and baked at 140° C. for 90 seconds to form a film having a thickness of 0.20 $\mu$m.

The wafer thus-obtained was exposed using an ArF excimer laser stepper (manufactured by ISI Co., Ltd.) on which a resolution mask was mounted, while changing exposure amount and focus. The wafer was heated in a clean room at 130° C. for 90 seconds. Deionized water was put on the resist film for 60 seconds and then removed. Thereafter, it was developed with a tetramethylammonium hydroxide developing solution (2.38%) (FHD-5) for 60 seconds, rinsed with distilled water and dried to obtain a pattern.

The resulting pattern was observed a scanning electron microscope. Specifically, a variation ratio of linewidth was evaluated in the following manner.

Variation Ratio of Linewidth:

A line pattern of 0.14 microns in the pattern formed above was measured for 5 minutes using a length-measuring SEM manufactured by Hitachi, Ltd. (800 [V], 7.1 [pA]) and a variation ratio of linewidth was calculated according to the following equation:

Variation Ratio of Linewidth=|Initial Linewidth—Final Linewidth|/Initial Linewidth The results obtained are shown in Table 2 below.

As is apparent from the results shown in Table 2, the positive photoresist compositions of the present invention are excellent in various characteristics, particularly, the variation rate of linewidth.

TABLE 2

| Example | Resin | Photo-Acid Generator | Organic Basic Compound | Surface Active Agent | Variation Ratio of Linewidth |
|---|---|---|---|---|---|
| 1 | 1 | PAG4-6 | 1 | 1 | 9 |
| 2 | 2 | PAG4-18 | 2 | 2 | 8 |
| 3 | 3 | SI-3 | 3 | 3 | 8 |
| 4 | 4 | SII-4 | 2 | 4 | 9 |
| 5 | 5 | SII-9 | 1 | 5 | 8 |
| 6 | 6 | SII-10 | 1 | 5 | 6 |
| 7 | 7 | SII-12 | 1 | 3 | 5 |
| 8 | 8 | PAG3-28 | 2 | 1 | 5 |
| 9 | 9 | PAG4-6/PAG7-1 = 6/1 | 2 | 1 | 5 |
| 10 | 1 | SII-3/SII-4 = 1/1 | 3 | 1 | 9 |
| 11 | 2 | SII-8/PAG7-2 = 7/1 | 3 | 2 | 8 |
| 12 | 3 | PAG4-6/PAG6-19 = 8/1 | 2 | 2 | 8 |
| 13 | 4 | PAG4-6/PAG4-5 = 5/1 | 1 | 5 | 8 |
| 14 | 5 | PAG4-6/PAG4-7 = 5/1 | 2 | 5 | 8 |
| 15 | 6 | PAG4-6/PAG3-29 = 6/1 | 2 | 5 | 6 |
| 16 | 7 | PAG4-6/PAG7-2 = 4/1 | 3 | 1 | 5 |
| 17 | 8 | SII-3/PAG7-1= 5/1 | 1 | 3 | 5 |
| 18 | 9 | SII-4/PAG7-3 = 10/1 | 3 | 5 | 5 |

Photo-Acid Generator:
[PAG7-1]

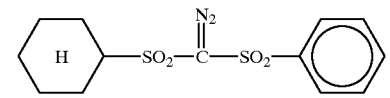

[PAG7-2]

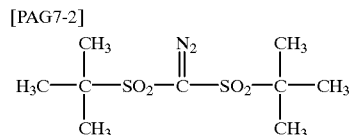

[PAG7-3]

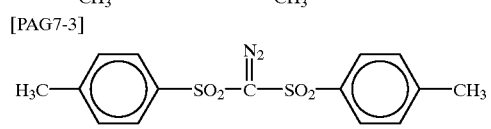

Organic Basic Compound:
1: DBU (1,8-Diazabicyclo[5,4,0]-7-undecene
2: 4-DAMP (4-Dimethylaminopyridine)
3: TPI (2,4,5-Triphenylimidazole)
Surface Active Agent:
(W-1): Megafac F176 (manufactured by Dainippon Ink and Chemicals, Inc.) (fluorine-base)
(W-2): Megafac R08 (manufactured by Dainippon Ink and Chemicals, Inc.) (fluorine and silicon-base)
(W-3): Polysiloxane Polymer KP-341 (manufactured by Shin-Etsu Chemical Co., Ltd.)
(W-4): Polyoxyethylene nonyl phenyl ether
(W-5): Troysol S-366 (manufactured by Troy Chemical Co., Ltd.)

While the present invention has been described in detail and with reference to specific embodiments thereof, it will be apparent to one skilled in the art that various changes and modifications can be made therein without departing from the spirit and scope thereof.

This application is based on Japanese patent application No. 2000-046129 filed on Feb. 23, 2000, the entire contents of which incorporated herein by reference.

What is claimed is:

1. A positive photoresist composition which comprises (A) a resin which contains a repeating unit represented by formula (I) shown below and a repeating unit represented by formula (II) shown below and whose solubility in an alkaline developing solution increases by the action of an acid and (B) a compound which generates an acid upon irradiation with an actinic ray or radiation,

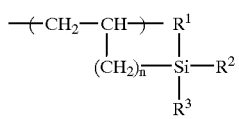

(I)

wherein $R^1$, $R^2$ and $R^3$, which may be the same or different, each independently represents an alkyl group, a haloalkyl group, a halogen atom, an alkoxy group, a trialkylsilyl group or a trialkylsilyloxy group; and n represents 0 or 1,

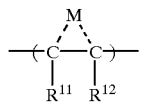

(II)

wherein M represents an atomic group necessary for forming an alicyclic structure, which may be substituted, together with the connected two carbon atoms (C—C) ; and $R^{11}$ and $R^{12}$, which may be the same or different, each independently represents a hydrogen atom, a cyano group, a halogen atom or an alkyl group which may be substituted.

2. The positive photoresist composition as claimed in claim 1, wherein the resin of (A) further contains at least one repeating unit represented by formulae (IIIa) and (IIIb) shown below:

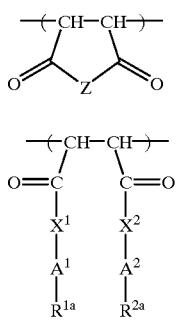

(IIIa)

(IIIb)

wherein Z represents an oxygen atom or N–$R^{3a}$; $R^{3a}$ represents a hydrogen atom, a hydroxy group, a straight-chain or branched chain alkyl group Or —O—SO$_2$—$R^{4a}$; $R^{4a}$ represents an alkyl group or a trihalomethyl group; $X^1$ and $X^2$, which may be the same or different, each independently represents an oxygen atom, a sulfur atom, —NH— or —NHSO$_2$—; $A^1$ and $A^2$, which may be the same or different, each represents a single bond or a divalent linkage group; $R^{1a}$ and $R^{2a}$, which may be the same or different, each represents a hydrogen atom, a cyano group, a hydroxy group, —COOH, —COOR$^{5a}$, —CO—NH—$R^{6a}$, an alkyl group which may be substituted, an alkoxy group which may be substituted or a cyclic hydrocarbon group which may contain an ester group or a carbonyl group in the bond for forming the ring and which may be substituted; $R^{5a}$ represents an alkyl group which may be substituted or a cyclic hydrocarbon group which may contain an ester group or a carbonyl group in the bond for forming the ring and which may be substituted; and $R^{6a}$ represents an alkyl group which may be substituted.

3. The positive photoresist composition as claimed in claim 1, wherein the alycyclic structure formed in formula (II) is an alyciclic structure having a bridged linkage.

4. The positive photoresist composition as claimed in claim 1, wherein the repeating unit represented by formula (II) is a repeating unit represented by the following formula (III-a) or (III-b):

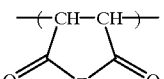

(IIIa)

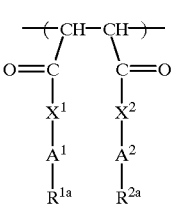

(IIIb)

wherein $R^{13}$ to $R^{16}$, which may be the same or different, each independently represents a hydrogen atom, a halogen atom, a cyano group, —COOH, —COOR$^{5a}$, an acid-decomposable group, —C(=O)—X—A—$R_{17}$ or an alkyl group which may be substituted or a cyclic hydrocarbon group which may be substituted, or at least two of $R^{13}$ to $R^{16}$ may be combined with each other to form a ring; n represents 0 or 1; X represents an oxygen atom, a sulfur atom, —NH—, —NHSO$_2$— or —NHSO$_2$NH—; A represents a single bond or a divalent linkage group; $R_{17}$ represents —COOH, —COOR$^{5a}$, —CN, a hydroxy group, an alkoxy group which may be substituted, —CO—NH—$R^{6a}$, —CO—NH—SO$_2$—$R^{6a}$ or a group —Y represented by the following formula:

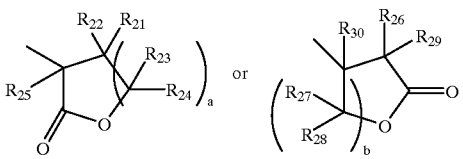

wherein $R_{21}$ to $R_{30}$, which may be the same or different, each independently represents a hydrogen atom or an alkyl group which may be substituted; a and b each represents 1 or 2; $R^{5a}$ represents an alkyl group which may be substituted or a cyclic hydrocarbon group which may contain an ester group or a carbonyl group in the bond for forming the ring and which may be substituted; and $R^{6a}$ represents an alkyl group which may be substituted.

5. The positive photoresist composition as claimed in claim 1, wherein the compound which generates an acid upon irradiation with an actinic ray or radiation of (B) is that selected from diazonium salts, ammonium salts, phosphonium salts, iodonium salts, sulfonium salts, selenonium salts, arsonium salts, organic halide compounds, organic metal/organic halide compounds, photo-acid generators having an o-nitrobenzyl type protective group, compounds which photolyze to generate a sulfonic acid, disulfone compounds, diazoketosulfone compounds and diazodisulfone compounds.

6. The positive photoresist composition as claimed in claim 1, wherein the content of the repeating unit represented by formula (I) in the resin (A) is from 3 to 50% by mole based on the total repeating units of the resin.

7. The positive photoresist composition as claimed in claim 1, wherein the content of the repeating unit represented by formula (II) in the resin (A) is from 15 to 50% by mole based on the total repeating units of the resin.

8. The positive photoresist composition as claimed in claim 2, wherein the content of the repeating unit represented by formula (IIIa) or (IIIb) in the resin (A) is from 30 to 70% by mole based on the total repeating units of the resin.

9. The positive photoresist composition as claimed in claim 1, wherein the content of the resin (A) in the positive photoresist composition is from 40 to 99.99% by weight based on the total solid content.

10. The positive photoresist composition as claimed in claim 1, wherein the compound which generates an acid upon irradiation with an actinic ray or radiation of (B) is an iodonium salt represented by formula (PAG3) shown below or a sulfonium salt represented by formula (PAG4) shown below:

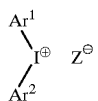 (PAG3)

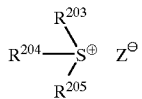 (PAG4)

wherein $Ar^1$ and $Ar^2$, which may be the same or different, each represents a substituted or unsubstituted aryl group; $R^{203}$, $R^{204}$ and $R^{205}$, which may be the same or different, each represents a substituted or unsubstituted alkyl group or a substituted or unsubstituted aryl group; and $Z^-$ represents a counter anion.

11. The positive photoresist composition as claimed in claim 1, wherein the compound which generates an acid upon irradiation with an actinic ray or radiation of (B) is a disulfone derivative represented by formula (PAG5) shown below or an iminosulfonate derivative represented by formula (PAG6) shown below:

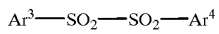 (PAG5)

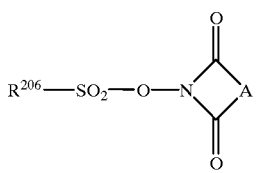 (PAG6)

wherein $Ar^3$ and $Ar^4$, which may be the same or different, each represents a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group or a substituted or unsubstituted arylene group.

12. The positive photoresist composition as claimed in claim 1, wherein the compound which generates an acid upon irradiation with an actinic ray or radiation of (B) is a diazodisulfone derivative represented by formula (PAG7) shown below:

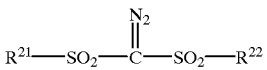 (PAG7)

wherein $R^{21}$ and $R^{22}$, which may be the same or different, each represents a substituted or unsubstituted alkyl group, a cycloalkyl group or a substituted or unsubstituted aryl group.

13. The positive photoresist composition as claimed in claim 1, wherein the compound which generates an acid upon irradiation with an actinic ray or radiation of (B) is an iodinuim salt represented by formula (sI) shown below or a sulfonium salt represented by formula (sII) shown below:

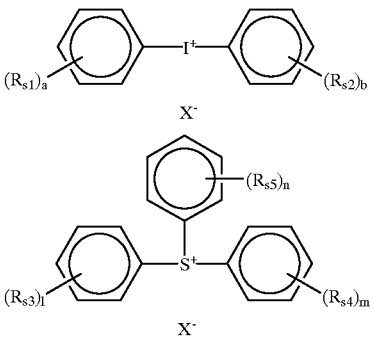

wherein $R_{s1}$, $R_{s2}$, $R_{s3}$, $R_{s4}$ and $R_{s5}$, which may be the same or different, each represents a hydrogen atom, an alkyl group which may be substituted, a cycloalkyl group which may be substituted, an alkoxy group which may be substituted, an alkoxycarbonyl group which may be substituted, an acyl group which may be substituted, an acyloxy group which may be substituted, a nitro group, a halogen atom, a hydroxy group or a carboxy group, provided that at least one of $R_{s1}$ and $R_{s2}$ represents an alkyl group having 5 or more carbon atoms which may be substituted, a cycloalkyl group having 5 or more carbon atoms which may be substituted, an alkoxy group having 5 or more carbon atoms which may be substituted, an alkoxycarbonyl group having 5 or more carbon atoms which may be substituted, an acyl group having 5 or more carbon atoms which may be substituted or an acyloxy group having 5 or more carbon atoms which may be substituted; a represents 1 to 5, b represents 1 to 5, 1 represents 1 to 5, m represents 0 to 5, n represents 0 to 5, provided that when 1+m+n=1, $R_{s3}$ represents an alkyl group which may be substituted, a cycloalkyl group which may be substituted, an alkoxy group which may be substituted, an alkoxycarbonyl group which may be substituted, an acyl group which may be substituted or an acyloxy group which may be substituted; and X represents R—SO$_3$ wherein R represents an aliphatic hydrocarbon group which may be substituted or an aromatic hydrocarbon group which may be substituted.

14. The positive photoresist composition as claimed in claim 1, wherein the composition further comprises a surface active agent.

15. The positive photoresist composition as claimed in claim 14, wherein the surface active agent is selected from a fluorine-base surface active agent, a silicon-base surface active agent, a surface active agent having both a fluorine atom and a silicon, and a nonionic surface active agent.

16. The positive photoresist composition as claimed in claim 1, wherein the composition further comprises an organic basic compound.

17. The positive photoresist composition as claimed in claim 16, wherein the organic basic compound is that having the structure represented by the following formula (A), (B), (C), (D) or (E):

(A)
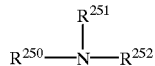

wherein $R^{250}$ $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbons atoms, or $R^{251}$ and $R^{252}$ may be combined with each other to form a ring;

(B)
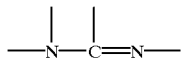

(C)
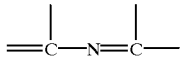

(D)
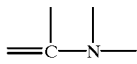

(E)
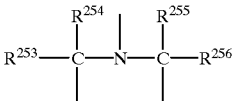

wherein $R^{253}$, $R^{254}$, $R^{255}$ and $R^{256}$, which may be the same or different, each represents an alkyl group having from 1 to 6 carbon atoms.

18. The positive photoresist composition as claimed in claim 1, wherein the composition further comprises a solvent.

* * * * *